(12) United States Patent
Tanaka et al.

(10) Patent No.: US 9,397,153 B2
(45) Date of Patent: Jul. 19, 2016

(54) SEMICONDUCTOR DEVICE

(71) Applicant: Semiconductor Energy Laboratory Co., Ltd., Atsugi-shi, Kanagawa-ken (JP)

(72) Inventors: Tetsuhiro Tanaka, Atsugi (JP); Toshihiko Takeuchi, Atsugi (JP); Yasumasa Yamane, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/486,179

(22) Filed: Sep. 15, 2014

(65) Prior Publication Data

US 2015/0084044 A1    Mar. 26, 2015

(30) Foreign Application Priority Data

Sep. 23, 2013  (JP) ................................. 2013-196301

(51) Int. Cl.
*H01L 21/8234* (2006.01)
*H01L 29/06* (2006.01)
*H01L 29/12* (2006.01)

(52) U.S. Cl.
CPC ............ *H01L 29/0607* (2013.01); *H01L 29/12* (2013.01)

(58) Field of Classification Search
CPC ...... H01L 29/06; H01L 29/0607; H01L 29/12
USPC .......................................................... 438/275
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Elias M Ullah
(74) *Attorney, Agent, or Firm* — Eric J. Robinson; Robinson Intellectual Property Law Office, P.C.

(57) ABSTRACT

Provided is a semiconductor device having a structure with which a decrease in electrical characteristics that becomes more significant with miniaturization can be suppressed. The semiconductor device includes a first oxide semiconductor film, a gate electrode overlapping with the first oxide semiconductor film, a first gate insulating film between the first oxide semiconductor film and the gate electrode, and a second gate insulating film between the first gate insulating film and the gate electrode. In the first gate insulating film, a peak appears at a diffraction angle 2θ of around 28° by X-ray diffraction. A band gap of the first oxide semiconductor film is smaller than a band gap of the first gate insulating film, and the band gap of the first gate insulating film is smaller than a band gap of the second gate insulating film.

42 Claims, 33 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,237,166 B2 | 8/2012 | Kumomi et al. |
| 8,384,080 B2 | 2/2013 | Taniguchi et al. |
| 8,547,771 B2 | 10/2013 | Koyama |
| 8,569,754 B2 | 10/2013 | Yamazaki et al. |
| 8,692,252 B2 | 4/2014 | Takata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0203214 A1 | 8/2013 | Isobe et al. |
| 2014/0048801 A1 | 2/2014 | Yamazaki et al. |
| 2014/0097867 A1 | 4/2014 | Koyama |
| 2015/0008428 A1 | 1/2015 | Yamamoto et al. |
| 2015/0011046 A1 | 1/2015 | Tanaka et al. |
| 2015/0011048 A1 | 1/2015 | Tanaka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2011-124360 A | 6/2011 |
| JP | 2011-138934 A | 7/2011 |
| JP | 2012-257187 A | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFe2O4, and YB2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), (InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev, B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW'09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

FIG. 2A1
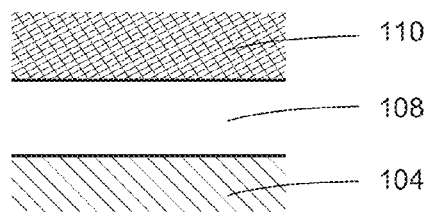
FIG. 2A2
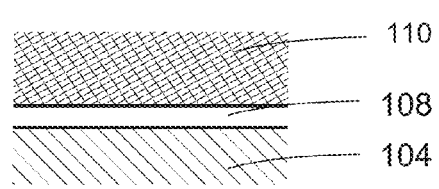
FIG. 2B
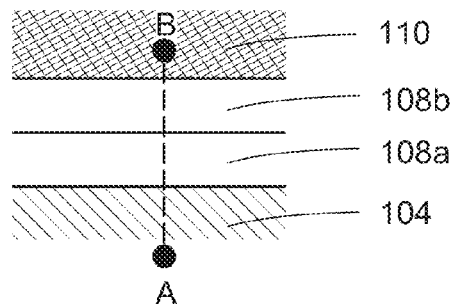

CAAC-OS nc-OS

FIG. 31A
FIG. 31B
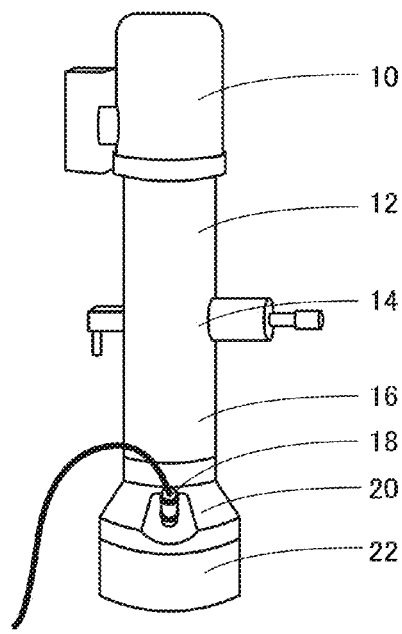
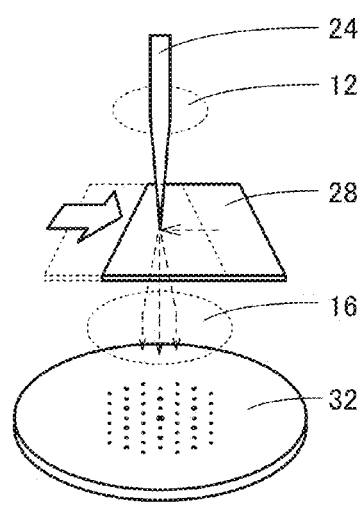

I: no baking
II: baking at 300 °C
III: baking at 350 °C
IV: baking at 400 °C

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a storage device, a driving method thereof, or a manufacturing method thereof. In particular, one embodiment of the present invention relates to a semiconductor device or a method for manufacturing a semiconductor device.

In this specification, a semiconductor device generally means a device that can function by utilizing semiconductor characteristics. A display device, an electro-optical device, a semiconductor circuit, and an electronic device may include a semiconductor device.

2. Description of the Related Art

A technique in which a transistor is formed using a semiconductor film has attracted attention. The transistor is used in a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including an amorphous oxide semiconductor film containing indium (In), gallium (Ga), and zinc (Zn) is disclosed in Patent Document 1.

Techniques for improving carrier mobility by stacking oxide semiconductor films are disclosed in Patent Documents 2 and 3.

It is known that a transistor including an oxide semiconductor film has an extremely small leakage current (off-state current) when the transistor is off. For example, a low-power-consumption CPU utilizing such a small leakage current characteristic of a transistor including an oxide semiconductor film is disclosed (see Patent Document 4).

REFERENCE

Patent Documents

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187

SUMMARY OF THE INVENTION

To obtain small off-state current, it is necessary to pay careful attention not only to the properties of oxide semiconductors but also to other components that cause leakage current.

For example, as the thickness of a gate insulating film becomes smaller, leakage current due to the gate insulating film increases. In a field-effect transistor (FET) having a three-dimensional structure (e.g., a FIN-type FET), leakage current due to a gate insulating film easily occurs because of a decrease in step coverage. However, in a miniaturized transistor, a reduction in the thickness of a gate insulating film is particularly important.

In view of the above, a gate insulating film that causes less leakage current is provided. Specifically, an equivalent oxide thickness (EOT) is made large by using a dielectric constant (high-k) insulating film of hafnium oxide or the like. Note that the equivalent oxide thickness is obtained by converting the physical thickness of a film to the electrical thickness equivalent for silicon oxide.

One object of one embodiment of the present invention is to provide a semiconductor device with large on-state current and small off-state current. Another object is to provide a semiconductor device having stable electrical characteristics. Another object is to provide a novel semiconductor device.

Note that the descriptions of these objects do not disturb the existence of other objects. In one embodiment of the present invention, there is no need to achieve all the above objects. Other objects will be apparent from and can be derived from the description of the specification, the drawings, the claims, and the like.

One embodiment of the present invention is a semiconductor device including a first oxide semiconductor film over an insulating surface, a second oxide semiconductor film over the first oxide semiconductor film, a source electrode and a drain electrode in contact with a side surface of the first oxide semiconductor film and a side surface and a top surface of the second oxide semiconductor film, a third oxide semiconductor film over the second oxide semiconductor film, a first gate insulating film over the third oxide semiconductor film, a second gate insulating film over the first gate insulating film, and a gate electrode on and in contact with the second gate insulating film. The gate electrode faces the top surface and the side surface of the second oxide semiconductor film. The first gate insulating film contains hafnium and the second gate insulating film contains silicon.

One embodiment of the present invention is a semiconductor device including a first oxide semiconductor film over an insulating surface; a second oxide semiconductor film over the first oxide semiconductor film; a third oxide semiconductor film over the second oxide semiconductor film; a first gate insulating film over the third oxide semiconductor film; a source electrode and a drain electrode in contact with a top surface of the first gate insulating film and side surfaces of the first oxide semiconductor film, the second oxide semiconductor film, the third oxide semiconductor film, and the first gate insulating film; a second gate insulating film over the first gate insulating film, the source electrode, and the drain electrode; and a gate electrode on and in contact with the second gate insulating film. The gate electrode faces a top surface and the side surface of the second oxide semiconductor film. The first gate insulating film contains hafnium and the second gate insulating film contains silicon.

In the above structure, the first oxide semiconductor film and the third oxide semiconductor film may contain one or more metal elements contained in the second oxide semiconductor film.

In the first gate insulating film in the above structure, a peak can be observed at a diffraction angle 2θ of around 28° by X-ray diffraction.

In the above structure, a band gap of the second oxide semiconductor film is smaller than a band gap of the first gate insulating film, and the band gap of the first gate insulating film is smaller than a band gap of the second gate insulating film.

One embodiment of the present invention is a semiconductor device including a first oxide semiconductor film, a gate electrode overlapping with the first oxide semiconductor film, a first gate insulating film between the first oxide semiconductor film and the gate electrode, and a second gate insulating film between the first gate insulating film and the gate electrode. In the first gate insulating film, a peak can be observed at a diffraction angle 2θ of around 28° by X-ray diffraction.

In the above structure, the first gate insulating film contains hafnium.

In the above structure, the second gate insulating film contains silicon.

In the above structure, the first oxide semiconductor film may be positioned between the second oxide semiconductor film and the third oxide semiconductor film between the first oxide semiconductor film and the first gate insulating film. The second oxide semiconductor film and the third oxide semiconductor film may each contain one or more metal elements contained in the first oxide semiconductor film.

In the above structure, a band gap of the first oxide semiconductor film is smaller than a band gap of the first gate insulating film, and the band gap of the first gate insulating film is smaller than a band gap of the second gate insulating film.

In the above structure, a film density of the first gate insulating film is preferably greater than or equal to 8.3 g/cm$^3$ and less than or equal to 9.0 g/cm$^3$.

In the above structure, a spectrum of the first gate insulating film obtained by electron spin resonance spectroscopy preferably indicates a spin density of less than or equal to $3.0 \times 10^{17}$ spins/cm$^3$ at a g-factor of 1.92 to 1.98 and indicates a spin density of greater than or equal to $4.4 \times 10^{16}$ spins/cm$^3$ and less than or equal to $3.5 \times 10^{18}$ spins/cm$^3$ at a g-factor of 2.00 to 2.01.

In the above structure, a signal of the first gate insulating film at a g-factor of 2.00 to 2.01 obtained by electron spin resonance spectroscopy may have an asymmetrical shape.

Owing to one embodiment of the present invention, any of the following semiconductor devices can be provided: a semiconductor device with large on-state current and small off-state current, a semiconductor device having stable electrical characteristics, and a novel semiconductor device. Note that the description of these effects does not disturb the existence of other effects. In one embodiment of the present invention, there is no need to obtain all the effects. Other effects will be apparent from and can be derived from the description of the specification, the drawings, the claims, and the like.

BRIEF DESCRIPTION OF THE DRAWINGS

FIGS. 2A1, 2A2, and 2B are each a conceptual diagram of a stacked-layer structure included in a semiconductor device of one embodiment of the present invention.

FIGS. 31A and 31B illustrate an example of a transmission electron diffraction measurement apparatus.

DETAILED DESCRIPTION OF THE INVENTION

Figure 1:
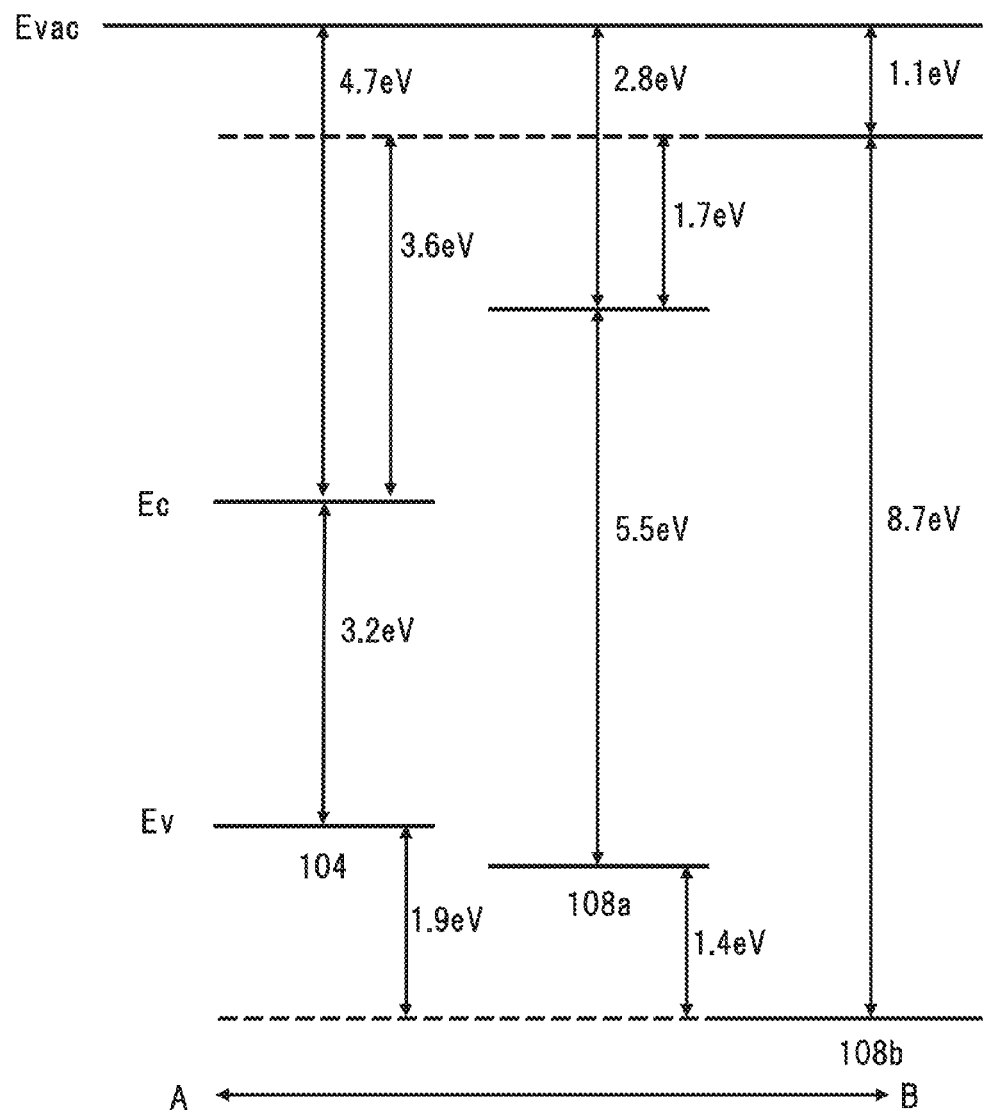
FIG. 1 is a band diagram of a stacked-layer structure included in a semiconductor device of one embodiment of the present invention.

Embodiments and examples will be described in detail with reference to drawings. The present invention is not limited to the following description and it will be readily appreciated by those skilled in the art that modes and details can be modified in various ways without departing from the spirit and the scope of the present invention. Therefore, the present invention should not be interpreted as being limited to the description of the embodiments and examples below. Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

Note that what is described (or part thereof) in an embodiment can be applied to, combined with, or exchanged with another content in the same embodiment and/or what is described (or part thereof) in another embodiment or other embodiments.

In each embodiment, a content described in the embodiment is a content described with reference to a variety of diagrams or a content described with a text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Embodiment 1

In this embodiment, a stacked-layer structure included in a semiconductor device of one embodiment of the present invention will be described with reference to FIGS. 2A1, 2A2, and 2B.

In one embodiment of the present invention, to reduce leakage current due to a gate insulating film, an equivalent oxide thickness is made large by using a high-k insulating film.

FIGS. 2A1 and 2A2 are conceptual diagrams of the stacked-layer structure included in the semiconductor device of one embodiment of the present invention.

FIGS. 2A1 and 2A2 each illustrate a semiconductor device including an oxide semiconductor film 104, a gate insulating film 108 over the oxide semiconductor film 104, and a gate electrode 110 overlapping with the oxide semiconductor film 104 with the gate insulating film 108 provided therebetween.

In FIG. 2A1, a high-k insulating film (here, hafnium oxide with a dielectric constant of 16) is used for the gate insulating film 108 of the semiconductor device. In FIG. 2A2, a general insulating film (here, silicon oxide with a dielectric constant of 3.9) is used for the gate insulating film 108 of the semiconductor device.

In the case where a material used as the gate insulating film 108 has a high dielectric constant, the gate insulating film 108 can be formed thick. For example, in the case of using hafnium oxide with a dielectric constant of 16, the gate insulating film 108 can be formed approximately four times as thick as the gate insulating film 108 using silicon oxide with a dielectric constant of 3.9. Thus, the gate insulating film 108 having a high dielectric constant and a large thickness is preferable because a short circuit due to a foreign substance (e.g., dust) can be prevented and a decrease in step coverage can be reduced.

However, although a physical thickness can be large, a high-k insulating film is easily polycrystallized; thus, leakage current due to a grain boundary might flow in some cases. Furthermore, the adhesion with a gate electrode might be decreased. Note that a high-k insulating film has low dielectric constant in an amorphous state and thus has a small effect of increasing a physical thickness. In addition, when a high-k insulating film is used in an amorphous state, the deposition temperature and the temperature of baking performed after the deposition have to be low, which might lead to poor film quality.

Thus, as illustrated in FIG. 2B, a gate insulating film 108b formed using a silicon oxide film, a silicon oxynitride film, or the like is provided between a gate insulating film 108a, which is a high-k insulating film, and the gate electrode 110; as a result, a physical thickness can be secured, leakage current due to a grain boundary can be reduced, and the adhesion with the gate electrode can be secured.

The gate insulating film 108a in contact with the oxide semiconductor film 104 is preferably an insulating film that supplies oxygen to the oxide semiconductor film 104 at the time of deposition. To introduce oxygen into a film below the gate insulating film 108a (i.e., the oxide semiconductor film 104) at the time of the deposition of the gate insulating film 108a, the deposition is performed in an atmosphere containing oxygen. Note that the proportion of oxygen is preferably large because much oxygen can be introduced. In addition, the gate insulating film 108a is preferably an insulating film having a function of blocking oxygen, hydrogen, water, and the like.

Owing to such an insulating film, oxygen can be supplied to the oxide semiconductor film at the time of the deposition of the gate insulating film, and in addition, oxygen in the oxide semiconductor film can be prevented from diffusing to the outside, which reduces oxygen vacancies in the oxide semiconductor film and prevents entry of hydrogen, water, and the like from the outside to the oxide semiconductor film.

Note that the gate insulating film 108a preferably has a peak at a diffraction angle 2θ of around 28° measured with X-ray diffraction. The peak that appears at 2θ of around 28° is assigned to the diffraction of the (−111) plane of a monoclinic crystal of hafnium oxide ($HfO_2$). An ESR signal due to oxygen vacancies in the gate insulating film 108a, which appears at a g-factor of 1.92 to 1.98, preferably indicates a spin density of less than or equal to the lower limit of detection (here, less than or equal to $3.0 \times 10^{17}$ spins/cm$^3$). Furthermore, an ESR signal due to excess oxygen in the gate insulating film 108a, which appears at a g-factor of 2.00 to 2.01, preferably indicates a spin density of greater than or equal to $4.4 \times 10^{16}$ spins/cm$^3$ and less than or equal to $3.5 \times 10^{18}$ spins/cm$^3$, further preferably greater than or equal to $1.8 \times 10^{17}$ spins/cm$^3$ and less than or equal to $1.0 \times 10^{18}$ spins/cm$^3$. In addition, the film density of the gate insulating film 108a is preferably greater than or equal to 8.3 g/cm$^3$ and less than or equal to 9.0 g/cm$^3$.

Note that as the gate insulating film 108a, an insulating film formed using an oxide (including a composite oxide) containing one or more elements selected from hafnium, aluminum, tantalum, zirconium, and the like can be used. It is preferable to use an insulating film formed using hafnium oxide, an insulating film formed using aluminum oxide, an insulating film formed using hafnium silicate, or an insulating film formed using aluminum silicate. A high dielectric constant (high-k) material such as hafnium oxide is preferably used for a gate insulating film because the thickness of the gate insulating film can be increased to prevent gate leakage. In this embodiment, an insulating film formed using hafnium oxide is formed as the gate insulating film 108a. It is possible to employ a sputtering method or an atomic layer deposition (ALD) method as a method for forming the gate insulating film 108a.

The gate insulating film 108b can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide.

As a method for forming the gate insulating film 108b, a sputtering method or an atomic layer deposition (ALD) method can be employed.

The film formation temperature of the gate insulating film 108a is preferably 100° C. or higher, more preferably 150° C. or higher. By forming the gate insulating film 108a in the above temperature range, attachment of hydrogen or a hydrogen compound (e.g., adsorbed water) to the oxide semiconductor film 104 which is below the gate insulating film 108a can be prevented, and entry of hydrogen or a hydrogen compound into the oxide semiconductor film 104 can be decreased. Hydrogen partly serves as donors by bonding to an oxide semiconductor and causes generation of electrons serving as carriers, whereby the threshold voltage of the transistor is shifted in the negative direction. Therefore, the gate insulating film 108a is formed while entry of hydrogen or a hydrogen compound into the oxide semiconductor film 104 is decreased; thus, electrical characteristics of the transistor can be further stabilized. The same can be applied to the film formation temperature of the gate insulating film 108b formed over the gate insulating film 108a.

FIG. 1 shows an example of a band diagram of the semiconductor device illustrated in FIG. 2B, from point A to point B. In FIG. 1, Evac denotes the energy of vacuum level, Ec denotes the conduction band minimum, and Ev denotes the valence band maximum.

In this example, an oxide semiconductor film whose atomic ratio of In to Ga, Zn, and O is 1:1:1:4 is used as the oxide semiconductor film 104, a hafnium oxide film is used as the gate insulating film 108a, and a silicon oxynitride film is used as the gate insulating film 108b.

As shown in FIG. 1, the band gap of the oxide semiconductor film 104 (3.2 eV) is smaller than the band gap of the gate insulating film 108a (5.5 eV), and the band gap of the gate insulating film 108a (5.5 eV) is smaller than the band gap of the gate insulating film 108b (8.7 eV). In addition, the electron affinity of the oxide semiconductor film 104 (4.7 eV) is larger than the electron affinity of the gate insulating film 108a (2.8 eV), and the electron affinity of the gate insulating film 108a (2.8 eV) is larger than the electron affinity of the gate insulating film 108b (1.1 eV).

As shown in FIG. 1, the conduction band minimum of the oxide semiconductor film 104 is the lowest and the conduction band minimum of the gate insulating film 108b is the highest among the conduction band minimums of the oxide semiconductor film 104, the gate insulating film 108a, and the gate insulating film 108b.

With such a band structure, the carrier density of an interface between the gate insulating film 108a (high-k insulating film) and the gate insulating film 108b (silicon oxide film or silicon oxynitride film) can be reduced when an FET is turned on; thus, stable electrical characteristics such as improved on-state current and a reduced S-value can be obtained regardless of the interface state density of the interface.

A structure in which an oxide semiconductor film is provided over and below the oxide semiconductor film 104 (i.e., an oxide semiconductor layer 404 in Embodiment 2) is preferably employed. The details of the structure will be described in Embodiment 2. Another oxide semiconductor film can be provided between the gate insulating film 108a and the oxide semiconductor film 104 in which a channel is formed, in which case a region to be a channel can be apart from the gate insulating film 108a. As a result, the influence of scattering of carriers at an interface between the gate insulating film 108a and an oxide semiconductor film over the oxide semiconductor film 104 (i.e., an oxide semiconductor film 404c in Embodiment 2) can be small.

The structures, methods, and the like described in this embodiment can be combined as appropriate with any of the structures, methods, and the like described in the other embodiments.

Embodiment 2

In this embodiment, a semiconductor device of one embodiment of the present invention is described with reference to drawings.
<Transistor Structure 1>

Figure 3A:
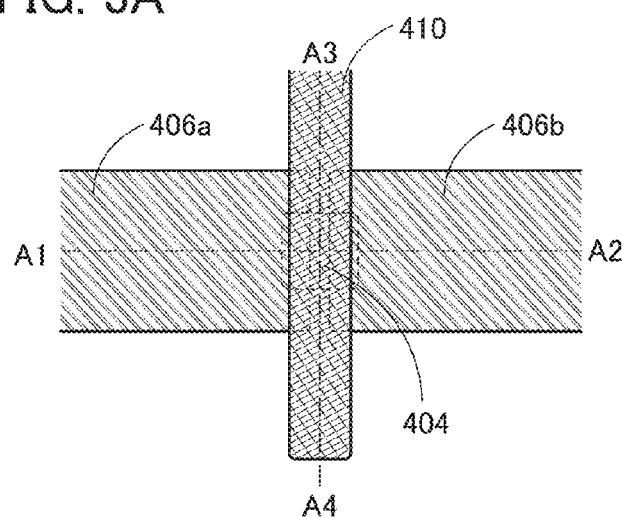
FIGS. 3A to 3C are a top view and cross-sectional views illustrating a transistor.
Figure 3B:
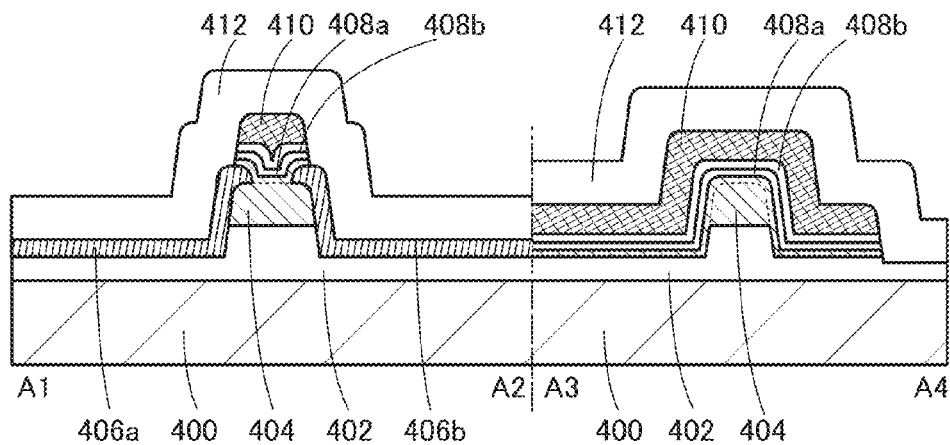
Figure 3C:
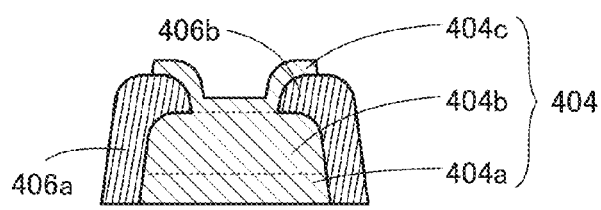

FIGS. 3A and 3B are a top view and a cross-sectional view of a transistor of one embodiment of the present invention. FIG. 3A is a top view and FIG. 3B is a cross-sectional view taken along dashed-dotted line A1-A2 and dashed-dotted line A3-A4 in FIG. 3A. Note that for simplification of the drawing, some components in the top view in FIG. 3A are not illustrated. FIG. 3C is an enlarged view of the oxide semiconductor layer 404 illustrated in FIG. 3B.

The transistor illustrated in FIGS. 3A to 3C includes a base insulating film 402 having a projecting portion over a substrate 400; an oxide semiconductor film 404a over the projecting portion of the base insulating film 402; an oxide semiconductor film 404b over the oxide semiconductor film 404a; a source electrode 406a and a drain electrode 406b in contact with the top surface and a side surface of the oxide semiconductor film 404b; the oxide semiconductor film 404c over the oxide semiconductor film 404b, the source electrode 406a, and the drain electrode 406b; a gate insulating film 408a over the oxide semiconductor film 404c; a gate insulating film 408b over the gate insulating film 408a; a gate electrode 410 that is in contact with the top surface of the gate insulating film 408b and faces the top surface and the side surface of the oxide semiconductor film 404b; and an insulating film 412 over the source electrode 406a, the drain electrode 406b, and the gate electrode 410. The base insulating film 402 does not need to include a projecting portion. Note that as illustrated in FIG. 3C, the oxide semiconductor film 404a, the oxide semiconductor film 404b, and the oxide semiconductor film 404c are collectively referred to as the oxide semiconductor layer 404, in some cases.

Note that at least part (or the whole) of the source electrode 406a (and/or the drain electrode 406b) is provided on at least part (or the whole) of a surface, a side surface, a top surface, and/or a bottom surface of a semiconductor film such as the oxide semiconductor film 404a (and/or the oxide semiconductor film 404b).

Alternatively, at least part (or the whole) of the source electrode 406a (and/or the drain electrode 406b) is in contact with at least part (or the whole) of a surface, a side surface, a top surface, and/or a bottom surface of a semiconductor film such as the oxide semiconductor film 404a (and/or the oxide semiconductor film 404b). Alternatively, at least part (or the whole) of the source electrode 406a (and/or the drain electrode 406b) is in contact with at least part (or the whole) of a semiconductor film such as the oxide semiconductor film 404a (and/or the oxide semiconductor film 404b).

Alternatively, at least part (or the whole) of the source electrode 406a (and/or the drain electrode 406b) is electrically connected to at least part (or the whole) of a surface, a side surface, a top surface, and/or a bottom surface of a semiconductor film such as the oxide semiconductor film 404a (and/or the oxide semiconductor film 404b). Alternatively, at least part (or the whole) of the source electrode 406a (and/or the drain electrode 406b) is electrically connected to at least part (or the whole) of a semiconductor film such as the oxide semiconductor film 404a (and/or the oxide semiconductor film 404b).

Alternatively, at least part (or the whole) of the source electrode 406a (and/or the drain electrode 406b) is provided near at least part (or the whole) of a surface, a side surface, a top surface, and/or a bottom surface of a semiconductor film such as the oxide semiconductor film 404a (and/or the oxide semiconductor film 404b). Alternatively, at least part (or the whole) of the source electrode 406a (and/or the drain electrode 406b) is provided near at least part (or the whole) of a semiconductor film such as the oxide semiconductor film 404a (and/or the oxide semiconductor film 404b).

Alternatively, at least part (or the whole) of the source electrode 406a (and/or the drain electrode 406b) is provided next to at least part (or the whole) of a surface, a side surface, a top surface, and/or a bottom surface of a semiconductor film such as the oxide semiconductor film 404a (and/or the oxide semiconductor film 404b). Alternatively, at least part (or the whole) of the source electrode 406a (and/or the drain electrode 406b) is provided next to at least part (or the whole) of a semiconductor film such as the oxide semiconductor film 404a (and/or the oxide semiconductor film 404b).

Alternatively, at least part (or the whole) of the source electrode 406a (and/or the drain electrode 406b) is provided obliquely above at least part (or the whole) of a surface, a side surface, a top surface, and/or a bottom surface of a semiconductor film such as the oxide semiconductor film 404a (and/or the oxide semiconductor film 404b). Alternatively, at least part (or the whole) of the source electrode 406a (and/or the drain electrode 406b) is provided obliquely above at least part (or the whole) of a semiconductor film such as the oxide semiconductor film 404a (and/or the oxide semiconductor film 404b).

Alternatively, at least part (or the whole) of the source electrode 406a (and/or the drain electrode 406b) is provided above at least part (or the whole) of a surface, a side surface, a top surface, and/or a bottom surface of a semiconductor film such as the oxide semiconductor film 404a (and/or the oxide semiconductor film 404b). Alternatively, at least part (or the whole) of the source electrode 406a (and/or the drain electrode 406b) is provided above at least part (or the whole) of a semiconductor film such as the oxide semiconductor film 404a (and/or the oxide semiconductor film 404b).

As illustrated in FIG. 3B, side surfaces of the source electrode 406a and the drain electrode 406b are in contact with the side surfaces of the oxide semiconductor layer 404. The oxide semiconductor layer 404 can be electrically surrounded by an electric field of the gate electrode 410 (a structure in which an oxide semiconductor layer is electrically surrounded by an electric field of a gate electrode is referred to as a surrounded channel (s-channel) structure). Therefore, a channel is formed in the entire oxide semiconductor layer 404 (bulk). In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

Note that a channel length refers to a distance between a source (a source region or a source electrode) and a drain (a drain region or a drain electrode) in a region where a semiconductor layer and a gate electrode overlap with each other in a top view. Accordingly, in FIG. 3A, a channel length is a distance between the source electrode 406a and the drain electrode 406b in a region where the oxide semiconductor layer 404 and the gate electrode 410 overlap with each other.

A channel width refers to the width of a source or a drain in a region where a semiconductor layer overlaps with a gate electrode. Accordingly, in FIG. 3A, a channel width (W) is the width of the source electrode 406a or the drain electrode 406b in a region where the oxide semiconductor layer 404 overlaps with the gate electrode 410.

For the gate insulating film 408a, refer to the description of the gate insulating film 108a. Note that the gate insulating film 408a may be either a single layer or a stacked layer.

For the gate insulating film 408b, refer to the description of the gate insulating film 108b. Note that the gate insulating film 408b may be either a single layer or a stacked layer.

The substrate 400 is not limited to a simple support, and may be a substrate where an element such as a transistor or a capacitor is formed. In that case, at least one of the gate electrode 410, the source electrode 406a, and the drain electrode 406b of the transistor may be electrically connected to the above element.

The base insulating film 402 can have a function of supplying oxygen to the oxide semiconductor layer 404 as well as a function of preventing diffusion of impurities from the substrate 400. Thus, the base insulating film 402 is preferably an insulating film containing oxygen. For example, an insulating film containing oxygen more than that in the stoichiometric composition is more preferable. Note that in the case where the substrate 400 is a substrate where an element is formed as described above, the base insulating film 402 has also a function as an interlayer insulating film. In that case, a surface of the base insulating film 402 may be planarized. For example, the base insulating film 402 may be subjected to planarization treatment such as chemical mechanical polishing (CMP) treatment.

The oxide semiconductor film 404b is described in detail below.

The oxide semiconductor film 404b is an oxide containing indium. An oxide can have high carrier mobility (electron mobility) by containing indium, for example. In addition, the oxide semiconductor film 404b preferably includes an element M. The element M is aluminum, gallium, yttrium, or tin, for example. The element M is an element having high bonding energy with oxygen, for example. The element M is an element that can increase the band gap of the oxide, for example. In addition, the oxide semiconductor film 404b preferably contains zinc. When the oxide contains zinc, the oxide is easily crystallized, for example. The energy at the top of the valence band of the oxide can be controlled with the atomic ratio of zinc, for example.

Note that the oxide semiconductor film 404b is not limited to the oxide containing indium. The oxide semiconductor film 404b may be a Zn—Sn oxide or a Ga—Sn oxide, for example.

As the oxide semiconductor film 404b, an oxide with a wide band gap is used. For example, the band gap of the oxide semiconductor film 404b is set to be greater than or equal to 2.5 eV and less than or equal to 4.2 eV, preferably greater than or equal 10 to 2.8 eV and less than or equal to 3.8 eV, further preferably greater than or equal to 3.0 eV and less than or equal to 3.5 eV.

In the case where the oxide semiconductor film 404b is formed by a sputtering method, a target containing indium is preferably used in order to reduce the number of particles. In addition, if an oxide target having a high atomic ratio of the element M is used, the conductivity of the target may be decreased. In the case where a target containing indium is used, the conductivity of the target can be increased and DC discharge and AC discharge are facilitated; therefore, film formation over a large-sized substrate can be easily performed. Thus, semiconductor devices can be manufactured with high productivity.

In the case where the oxide semiconductor film 404b is formed by a sputtering method, the atomic ratio of In to M and Zn contained in the target may be 3:1:1, 3:1:2, 3:1:4, 1:1:0.5, 1:1:1, 1:1:2, or the like.

In the case where the oxide semiconductor film 404b is formed by a sputtering method, a film having an atomic ratio different from the atomic ratio of the target used may be formed. Especially for zinc, the atomic ratio of zinc in a deposited film is smaller than the atomic ratio of the target in some cases. Specifically, the proportion of zinc in the film is approximately 40 atomic % to 90 atomic % of that of zinc in the target in some cases.

An influence of impurities in the oxide semiconductor film 404b is described below. In order to obtain stable electrical characteristics of a transistor, it is effective to reduce the concentration of impurities in the oxide semiconductor film 404b to have lower carrier density so that the oxide semiconductor film 404b is highly purified. The carrier density of the oxide semiconductor film 404b is set to be lower than $1\times10^{17}/cm^3$, lower than $1\times10^{15}/cm^3$, or lower than $1\times10^{13}$ $cm^3$. In order to reduce the concentration of impurities in the oxide semiconductor film 404b, the concentration of impurities in a film which is adjacent to the oxide semiconductor film 404b are preferably reduced.

For example, silicon in the oxide semiconductor film 404b might serve as a carrier trap or a carrier generation source. Therefore, the concentration of silicon in a region between the oxide semiconductor film 404b and the base insulating film 402 measured by secondary ion mass spectrometry (SIMS) is set to be lower than $1\times10^{19}$ atoms/$cm^3$, preferably lower than $5\times10^{18}$ atoms/$cm^3$, further preferably lower than $2\times10^{18}$ atoms/$cm^3$. The concentration of silicon in a region between the oxide semiconductor film 404b and the gate insulating film 408a measured by SIMS is set to be lower than $1\times10^{19}$ atoms/$cm^3$, preferably lower than $5\times10^{18}$ atoms/$cm^3$, further preferably lower than $2\times10^{18}$ atoms/$cm^3$.

Furthermore, when hydrogen is contained in the oxide semiconductor film 404b, the carrier density is increased in some cases. The concentration of hydrogen in the oxide semiconductor film 404b measured by SIMS is set to be lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. When nitrogen is contained in the oxide semiconductor film 404b, the carrier density is increased in some cases. The concentration of nitrogen in the oxide semiconductor film 404b measured by SIMS is set to be lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

It is preferable to reduce the concentration of hydrogen in the base insulating film 402 in order to reduce the concentration of hydrogen in the oxide semiconductor film 404b. The concentration of hydrogen in the base insulating film 402 measured by SIMS is set to be lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. It is preferable to reduce the concentration of nitrogen in the base insulating film 402 in order to reduce the concentration of nitrogen in the oxide semiconductor film 404b. The concentration of nitrogen in the base insulating film 402 measured by SIMS is set to be lower than $5\times10^{19}$ atoms/$cm^3$, preferably lower than or equal to $5\times10^{18}$ atoms/$cm^3$, further preferably lower than or equal to $1\times10^{17}$ atoms/$cm^3$, still further preferably lower than or equal to $5\times10^{17}$ atoms/$cm^3$.

It is preferable to reduce the concentration of hydrogen in the gate insulating film 408a in order to reduce the concentration of hydrogen in the oxide semiconductor film 404b. The concentration of hydrogen in the gate insulating film 408a measured by SIMS is set to be lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. It is preferable to reduce the concentration of nitrogen in the gate insulating film 408a in order to reduce the concentration of nitrogen in the oxide semiconductor film 404b. The concentration of nitrogen in the gate insulating film 408a measured by SIMS is set to be lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

A structure of an oxide semiconductor film that can be used as the oxide semiconductor film 404b is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a clear grain boundary is not observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter, such a surface is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (bright spots) indicating alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 30A).

From the results of the cross-sectional TEM image and the plan-view TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is assigned to the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

In this specification, the trigonal and rhombohedral crystal systems are included in the hexagonal crystal system.

When the CAAC-OS film is analyzed by an in-plane method in which an X-ray enters a sample in a direction substantially perpendicular to the c-axis, a peak appears frequently when 2θ is around 56°. This peak is assigned to the (110) plane of the InGaZnO$_4$ crystal. Analysis (φ scan) is performed under conditions where the sample is rotated around a normal vector of the sample surface as an axis (φ axis) with 2θ fixed at around 56°. When the sample is a single-crystal oxide semiconductor film of InGaZnO$_4$, six peaks appear. The six peaks are assigned to crystal planes equivalent to the (110) plane. In contrast, in the case of a CAAC-OS film, a peak is not clearly observed even when φ scan is performed with 2θ fixed at around 56°.

The above results mean that in the CAAC-OS film having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is oriented in a direction parallel to a normal vector of a formation surface or a normal vector of a top surface. Thus, for example, when the shape of the CAAC-OS film is changed by etching or the like, the c-axis might not be necessarily parallel to a normal vector of a formation surface or a normal vector of a top surface of the CAAC-OS film.

Furthermore, the degree of crystallinity in the CAAC-OS film is not necessarily uniform. For example, if crystal growth leading to the CAAC-OS film occurs from the vicinity of the top surface of the film, the degree of the crystallinity in the vicinity of the top surface may be higher than that in the vicinity of the formation surface. Moreover, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak may be observed at 2θ of around 36°, in addition to the peak that appears at 2θ of around 31°. The peak that appears at 2θ of around 36° indicates that a crystal having no c-axis alignment is included in part of the CAAC-OS film. It is preferable that a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity if contained in the oxide semiconductor film. Note that the impurity contained in the oxide semiconductor film might serve as a carrier trap or a carrier generation source.

The CAAC-OS film is an oxide semiconductor film having a low density of defect states. Oxygen vacancies in the oxide semiconductor film may serve as carrier traps or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor using the oxide semiconductor film rarely has a negative threshold voltage (rarely has normally-on characteristics). A highly purified intrinsic or substantially highly purified intrinsic oxide semiconductor film has few carrier traps. Accordingly, the transistor using the oxide semiconductor film has a small change in electrical characteristics and high reliability. Note that charges trapped in the carrier traps in the oxide semiconductor film take a long time to be released and may behave like fixed charges. Thus, the transistor using the oxide semiconductor film with a high impurity concentration and a high density of defect states has unstable electrical characteristics in some cases.

In a transistor using the CAAC-OS film, change in electrical characteristics due to irradiation with visible light or ultraviolet light is small.

Next, a microcrystalline oxide semiconductor film is described.

In an image obtained with a TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal 10 to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a crystal grain boundary cannot be found clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 30B).

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

FIG. 31A illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 does not need to be provided.

FIG. 31B illustrates an internal structure of the transmission electron diffraction measurement apparatus illustrated in FIG. 31A. In the transmission electron diffraction measurement apparatus, a substance 28 that is positioned in the sample chamber 14 is irradiated with electrons emitted from an electron gun installed in the electron gun chamber 10 through the optical system 12. Electrons passing through the substance 28 enter a fluorescent plate 32 provided in the observation chamber 20 through the optical system 16. On the fluorescent plate 32, a pattern corresponding to the intensity of the incident electron appears, which allows measurement of a transmission electron diffraction pattern.

The camera 18 is installed so as to face the fluorescent plate 32 and can take a picture of a pattern appearing in the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. The holder may have, for example, a function of moving the substance 28 in the directions of the X-axis, Y-axis, and Z-axis. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 28.

Then, a method for measuring a transmission electron diffraction pattern of a substance by the transmission electron diffraction measurement apparatus described above is described.

Figure 30A:
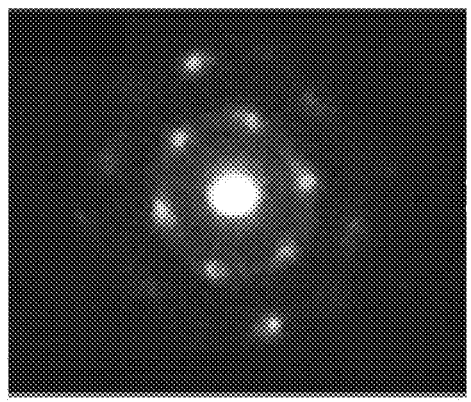
FIGS. 30A and 30B each show a nanobeam electron diffraction pattern of an oxide semiconductor film.
Figure 30B:
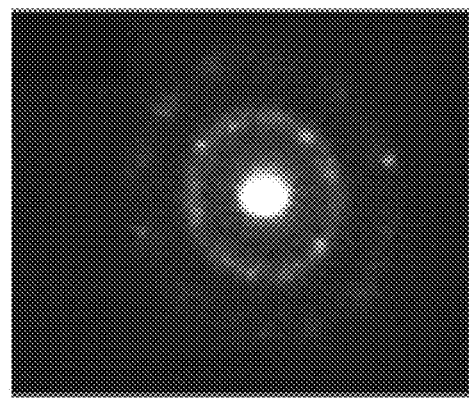

For example, changes in the structure of a substance can be observed by changing (scanning) the irradiation position of the electrons 24 that are a nanobeam in the substance, as illustrated in FIG. 31B. At this time, when the substance 28 is a CAAC-OS film, a diffraction pattern as shown in FIG. 30A is observed. When the substance 28 is an nc-OS film, a diffraction pattern shown in FIG. 30B is observed.

Even when the substance 28 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 60%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-depo") and a top surface of a sample including a CAAC-OS film subjected to heat treatment at 350° C. or 450° C. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanometer-size electron beam with a probe diameter of 1 nm was used.

Figure 32:
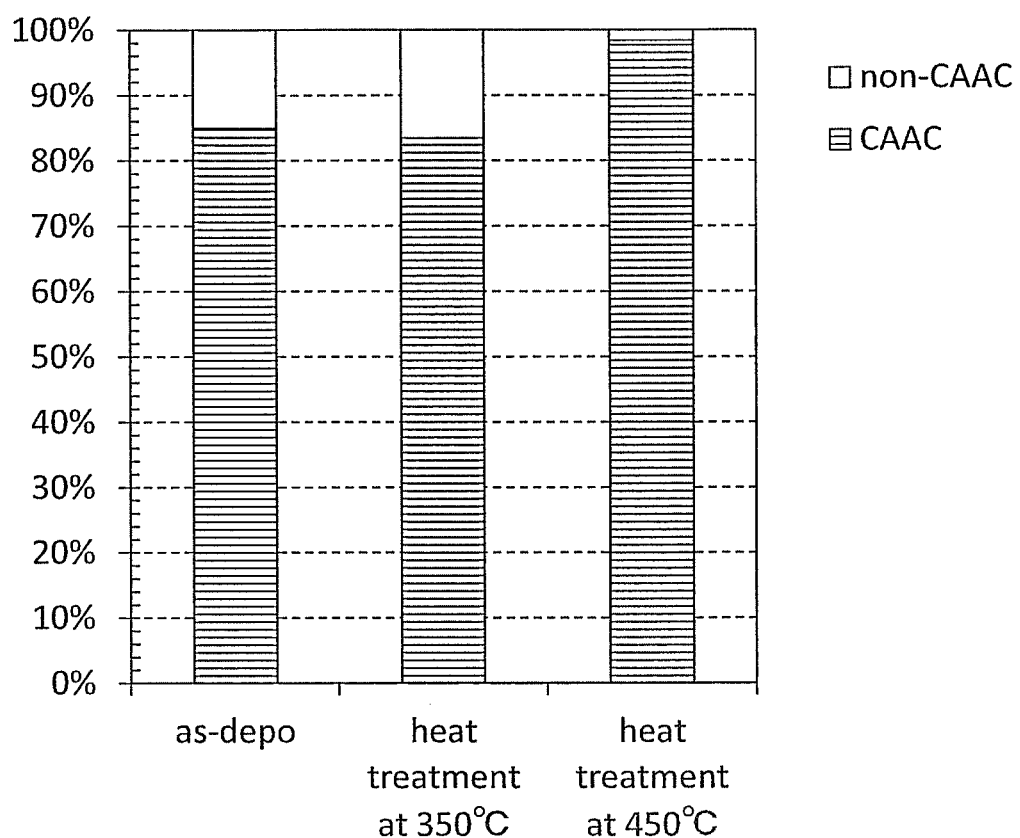
FIG. 32 shows an example of a structure analysis by transmission electron diffraction measurement.

FIG. 32 shows the proportion of CAAC in each sample. The proportion of CAAC of the sample after heat treatment at 450° C. is high compared with those of the sample of as-depo and the sample after heat treatment at 350° C. That is, heat treatment at a temperature higher than 350° C. (e.g., higher than or equal to 400° C.) reduces the proportion of non-CAAC (increases the proportion of CAAC). Here, most of diffraction patterns different from that of a CAAC-OS film are diffraction patterns similar to that of an nc-OS film. Therefore, the above results suggest that the region having a structure similar to that of an nc-OS film is rearranged by the heat treatment owing to the influence of the structure of the adjacent region, whereby the region becomes CAAC.

With such a measurement method, the structure of an oxide semiconductor film having a plurality of structures can be analyzed in some cases.

The oxide semiconductor film 404a and the oxide semiconductor film 404c include one or more elements other than oxygen included in the oxide semiconductor film 404b. Since the oxide semiconductor film 404a and the oxide semiconductor film 404c each include one or more elements other than oxygen included in the oxide semiconductor film 404b, an interface state is less likely to be formed at the interface between the oxide semiconductor film 404a and the oxide semiconductor film 404b and the interface between the oxide semiconductor film 404b and the oxide semiconductor film 404c.

In the case of using an In-M-Zn oxide for the oxide semiconductor film 404a, when Zn and O are not taken into consideration, the proportion of In and the proportion of M are preferably less than 50 atomic % and greater than or equal to 50 atomic %, respectively, more preferably less than 25 atomic % and greater than or equal to 75 atomic %, respectively. In the case of using an In-M-Zn oxide for the oxide semiconductor film 404b, when Zn and O are not taken into consideration, the proportion of In and the proportion of M are preferably greater than or equal to 25 atomic % and less than 75 atomic %, respectively, more preferably greater than or equal to 34 atomic % and less than 66 atomic %, respectively. In the case of using an In-M-Zn oxide for the oxide semiconductor film 404c, when Zn and O are not taken into consideration, the proportion of In and the proportion of M are preferably less than 50 atomic % and greater than or equal to 50 atomic %, respectively, more preferably less than 25 atomic % and greater than or equal to 75 atomic %, respectively. Note that the oxide semiconductor film 404c may be an oxide that is a type the same as that of the oxide semiconductor film 404a.

Here, in some cases, there is a mixed region of the oxide semiconductor film 404a and the oxide semiconductor film 404b between the oxide semiconductor film 404a and the oxide semiconductor film 404b. Further, in some cases, there is a mixed region of the oxide semiconductor film 404b and the oxide semiconductor film 404c between the oxide semiconductor film 404b and the oxide semiconductor film 404c. The mixed region has a low interface state density. For that reason, the stack of the oxide semiconductor film 404a, the oxide semiconductor film 404b, and the oxide semiconductor film 404c has a band structure where energy at each interface and in the vicinity of the interface is changed continuously (continuous junction).

As the oxide semiconductor film 404b, an oxide having an electron affinity higher than those of the oxide semiconductor films 404a and 404c is used. For example, as the oxide semiconductor film 404b, an oxide having an electron affinity higher than those of the oxide semiconductor films 404a and 404c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

At this time, when an electric field is applied to the gate electrode 410, a channel is formed in the oxide semiconductor film 404b having the highest electron affinity in the oxide semiconductor film 404a, the oxide semiconductor film 404b, and the oxide semiconductor film 404c.

Moreover, the thickness of the oxide semiconductor film 404c is preferably as small as possible to increase the on-state current of the transistor. The thickness of the oxide semiconductor film 404c is set to be less than 10 nm, preferably less than or equal to 5 nm, further preferably less than or equal to 3 nm, for example. Meanwhile, the oxide semiconductor film 404c has a function of blocking elements other than oxygen (such as silicon) included in the gate insulating film 408a from entering the oxide semiconductor film 404b where a channel is formed. For this reason, it is preferable that the oxide semiconductor film 404c have a certain thickness. The thickness of the oxide semiconductor film 404c is set to be greater than or equal to 0.3 nm, preferably greater than or equal to 1 nm, further preferably greater than or equal to 2 nm, for example.

To improve reliability, preferably, the thickness of the oxide semiconductor film 404a is large and the thickness of the oxide semiconductor film 404c is small. Specifically, the thickness of the oxide semiconductor film 404a is set to be greater than or equal to 20 nm, preferably greater than or equal to 30 nm, further preferably greater than or equal to 40 nm, still further preferably greater than or equal to 60 nm. With the oxide semiconductor film 404a having a thickness greater than or equal to 20 nm, preferably greater than or equal to 30 nm, further preferably greater than or equal to 40 nm, still further preferably greater than or equal to 60 nm, the distance from the interface between the base insulating film 402 and the oxide semiconductor film 404a to the oxide semiconductor film 404b where the channel is formed can be greater than or equal to 20 nm, preferably greater than or equal to 30 nm, further preferably greater than or equal to 40 nm, still further preferably greater than or equal to 60 nm. Note that since the productivity of a semiconductor device might be reduced, the thickness of the oxide semiconductor film 404a is set to be less than or equal to 200 nm, preferably less than or equal to 120 nm, further preferably less than or equal to 80 nm.

For example, the concentration of silicon in a region between the oxide semiconductor film 404b and the oxide semiconductor film 404a measured by SIMS is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$. The concentration of silicon in a region between the oxide semiconductor film 404b and the oxide semiconductor film 404c measured by SIMS is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$.

It is preferable to reduce the concentration of hydrogen in the oxide semiconductor film 404a and the oxide semiconductor film 404c in order to reduce the concentration of hydrogen in the oxide semiconductor film 404b. The concentration of hydrogen in the oxide semiconductor film 404a and the oxide semiconductor film 404c measured by SIMS is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is preferable to reduce the concentration of nitrogen in the oxide semiconductor film 404a and the oxide semiconductor film 404c in order to reduce the concentration of nitrogen in the oxide semiconductor film 404b. The concentration of nitrogen in the oxide semiconductor film 404a and the oxide semiconductor film 404c measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{7}$ atoms/cm$^3$.

The above three-layer structure is an example. For example, a two-layer structure without the oxide semiconductor film 404a or the oxide semiconductor film 404c may be employed.

As the source electrode 406a and the drain electrode 406b, a conductive film capable of extracting oxygen from the oxide semiconductor film is preferably used. As an example of the conductive film capable of extracting oxygen from the oxide semiconductor film, a conductive film containing aluminum, titanium, chromium, nickel, molybdenum, tantalum, tungsten, or the like can be given.

By the conductive film capable of extracting oxygen from the oxide semiconductor film, oxygen in the oxide semiconductor film is released to form oxygen vacancies in the oxide semiconductor film in some cases. Oxygen is more likely to be extracted, as the temperature is higher. Since the manufacturing process of the transistor involves some heat treatment steps, oxygen vacancies in a region of the oxide semiconductor film, which is in contact with the source electrode or the drain electrode, are likely formed. Furthermore, hydrogen enters sites of oxygen vacancies by heating, and thus the oxide semiconductor film becomes n-type in some cases. Thus, due to the source electrode and the drain electrode, the resistance of a region where the oxide semiconductor film is in contact with the source electrode or the drain electrode is reduced, so that the on-state resistance of the transistor can be reduced.

In the case where a transistor with a short channel length (e.g., less than or equal to 200 nm, or less than or equal to 100 nm) is manufactured, a source and a drain might be short-circuited due to formation of an n-type region. Therefore, in the case where a transistor with a short channel length is manufactured, a conductive film capable of appropriately extracting oxygen from an oxide semiconductor film may be used as the source electrode and the drain electrode. As the conductive film capable of appropriately extracting oxygen, a conductive film containing nickel, molybdenum, or tungsten can be used, for example.

Furthermore, in the case where a transistor with an extremely short channel length (less than or equal to 40 nm, or less than or equal to 30 nm) is manufactured, a conductive film which is less likely to extract oxygen from an oxide semiconductor film may be used as the source electrode $406a$ and the drain electrode $406b$. As an example of the conductive film which is less likely to extract oxygen from an oxide semiconductor film, a conductive film containing tantalum nitride, titanium nitride, or ruthenium can be given. Note that plural kinds of conductive films may be stacked.

The gate electrode 410 may be formed using a conductive film containing one or more of aluminum, titanium, chromium, cobalt, nickel, copper, yttrium, zirconium, molybdenum, ruthenium, silver, tantalum, tungsten, and the like.

The insulating film 412 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like.

Next, a method for manufacturing the transistor is described with reference to FIGS. 4A to 4C and FIGS. 5A to 5C.

Figure 4A:
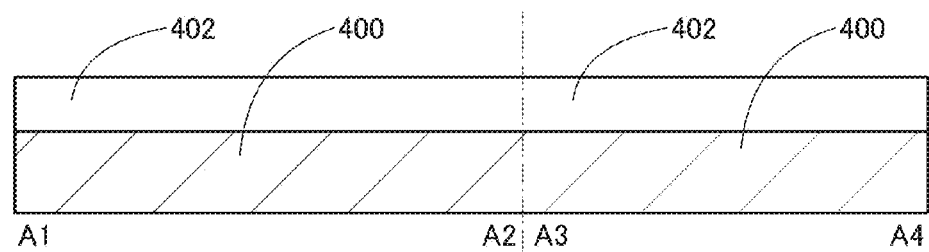
FIGS. 4A to 4C illustrate a method for manufacturing a transistor.

First, the base insulating film 402 is formed over the substrate 400 (see FIG. 4A).

The base insulating film 402 may be formed by a sputtering method, a chemical vapor deposition (CVD) method, a metal organic CVD (MOCVD) method, a plasma-enhanced CVD (PECVD) method, a molecular beam epitaxy (MBE) method, an atomic layer deposition (ALD) method, or a pulsed laser deposition (PLD) method. It is preferable to use an MOCVD method or an ALD method in order to reduce plasma damage.

Then, in order to planarize the surface of the base insulating film 402, CMP treatment may be performed. By CMP treatment, the average surface roughness (Ra) of the base insulating film 402 is less than or equal to 1 nm, preferably less than or equal to 0.3 nm, more preferably less than or equal to 0.1 nm. In some cases, Ra that is less than or equal to the above value can increase the crystallinity of the oxide semiconductor layer 404. Note that Ra can be measured using an atomic force microscope (AFM).

Then, oxygen may be added to the base insulating film 402 so that an insulating film containing excess oxygen can be formed. Oxygen may be added by plasma treatment, an ion implantation method, or the like. In the case where the addition of oxygen may be performed by an ion implantation method, the acceleration voltage may be higher than or equal to 2 kV and lower than or equal to 100 kV and the dose is greater than or equal to $5\times10^{14}$ ions/cm$^2$ and less than or equal to $5\times10^{16}$ ions/cm$^2$, for example.

Figure 4B:
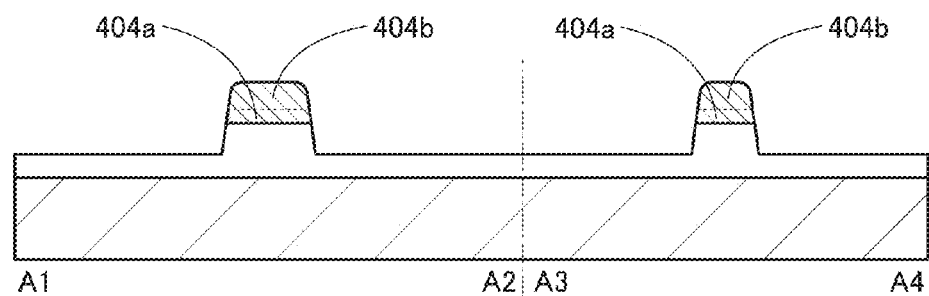

Next, the oxide semiconductor film $404a$ and the oxide semiconductor film $404b$ are formed over the base insulating film 402 by a sputtering method, a CVD method, an MOCVD method, a PECVD method, an MBE method, an ALD method, or a PLD method (see FIG. 4B). It is preferable to use an MOCVD method or an ALD method in order to reduce plasma damage. The base insulating film 402 may be appropriately etched. By etching the base insulating film 402 appropriately, the gate electrode 410 to be formed later can cover the oxide semiconductor layer 404 easily. Note that in order to miniaturize the transistor, a hard mask may be used in processing the oxide semiconductor film $404a$ and the oxide semiconductor film $404b$.

It is preferable that the oxide semiconductor film $404a$ and the oxide semiconductor film $404b$ are successively formed without exposure to the air.

In order to obtain an oxide semiconductor layer in which entry of impurities is decreased and which has high crystallinity, the oxide semiconductor film $404a$ and the oxide semiconductor film $404b$ are formed at a substrate temperature of higher than or equal to 100° C., preferably higher than or equal to 150° C., more preferably higher than or equal to 200° C. As an oxygen gas or an argon gas used as a deposition gas, a highly purified gas whose dew point is lower than or equal to −40° C., preferably lower than or equal to −80° C., more preferably lower than or equal to −100° C. is used. The state in which impurity concentration is low and density of defect states is low (the number of oxygen vacancies is small) is referred to as "highly purified intrinsic" or "substantially highly purified intrinsic".

First heat treatment may be performed after the oxide semiconductor film $404a$ and the oxide semiconductor film $404b$ are formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor film $404a$ and the oxide semiconductor film $404b$ can be improved, and in addition, impurities such as hydrogen and water can be removed from the base insulating film 402.

Figure 4C:
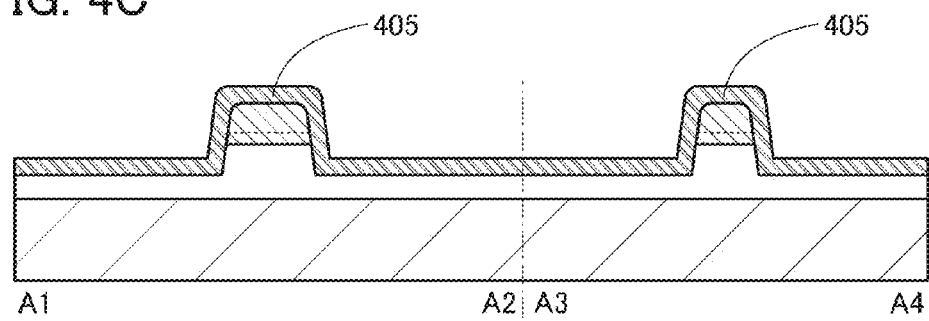

Next, a conductive film 405 which is to be the source electrode $406a$ and the drain electrode $406b$ and is in contact with the side surface of the oxide semiconductor film $404a$ and the top surface and the side surface of the oxide semiconductor film $404b$ is formed (see FIG. 4C). The conductive film 405 can be formed by a CVD method, an MOCVD method, a PECVD method, an MBE method, an ALD method, or a PLD method. It is preferable to use an MOCVD method or an ALD method in order to reduce plasma damage.

Figure 5A:
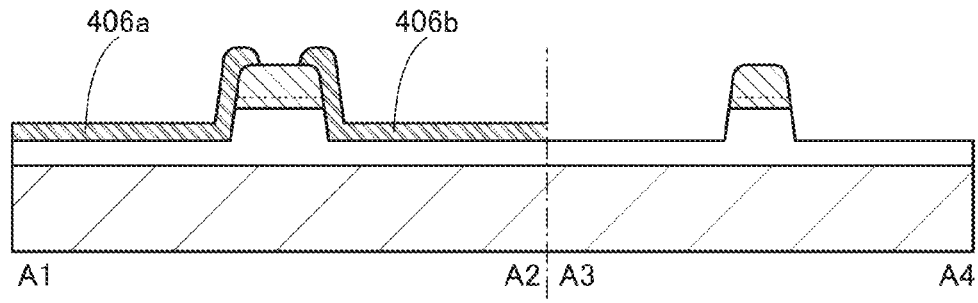
FIGS. 5A to 5C illustrate a method for manufacturing a transistor.

Next, the conductive film 405 is divided by etching to form the source electrode 406a and the drain electrode 406b (see FIG. 5A). Note that when the conductive film 405 is etched, end portions of the source electrode 406a and the drain electrode 406b are rounded (curved) in some cases. Furthermore, when the conductive film 405 is etched, the base insulating film 402 may be etched appropriately.

Then, the oxide semiconductor film 404c is formed over the oxide semiconductor film 404b, the source electrode 406a, and the drain electrode 406b.

Subsequently, the gate insulating film 408a is formed over the oxide semiconductor film 404c. The gate insulating film 408a can be formed by a sputtering method, a CVD method, an MOCVD method, a PECVD method, an MBE method, an ALD method, or a PLD method. It is preferable to use an MOCVD method or an ALD method in order to reduce plasma damage.

After that, the gate insulating film 408b is formed over the gate insulating film 408a. The gate insulating film 408b can be formed by a sputtering method, a CVD method, an MOCVD method, a PECVD method, an MBE method, an ALD method, or a PLD method. It is preferable to use an MOCVD method or an ALD method in order to reduce plasma damage.

Next, second heat treatment may be performed. The second heat treatment may be performed at a temperature lower than 500° C., preferably lower than 400° C., in an inert gas atmosphere, an atmosphere containing an oxidizing gas at 10 ppm or more, or a reduced pressure state. Alternatively, the second heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the second heat treatment, impurities such as hydrogen and water can be removed from the gate insulating film 408b.

Figure 5B:
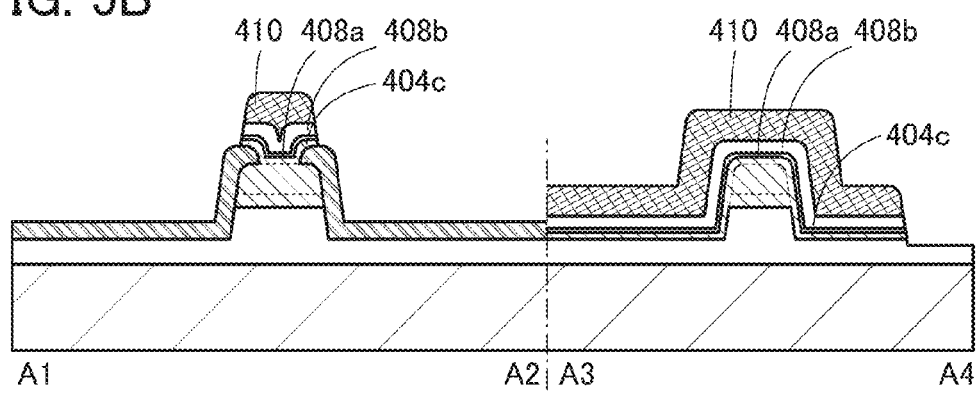

Then, the gate electrode 410 is formed over the gate insulating film 408b (see FIG. 5B). The gate electrode 410 can be formed by a sputtering method, a CVD method, an MOCVD method, a PECVD method, an MBE method, an ALD method, or a PLD method. It is preferable to use an MOCVD method or an ALD method in order to reduce plasma damage.

Figure 5C:
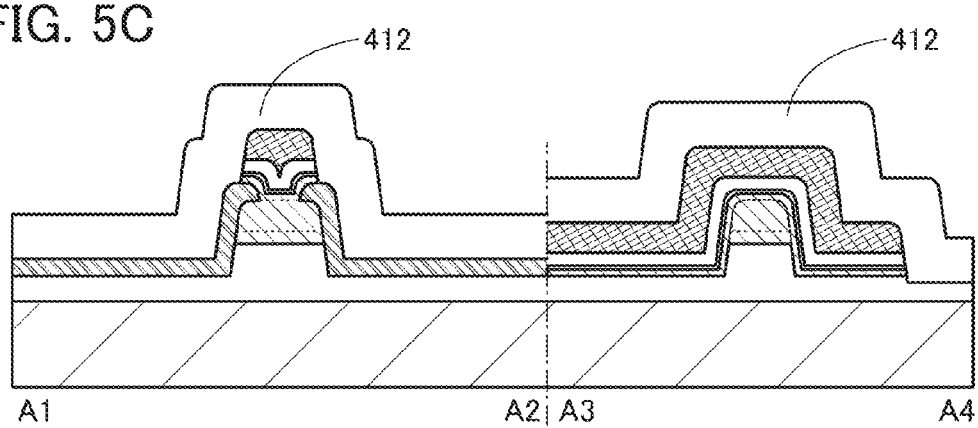

Subsequently, the insulating film 412 is formed over the source electrode 406a, the drain electrode 406b, the gate insulating film 408a, the gate insulating film 408b, and the gate electrode 410 (see FIG. 5C). The insulating film 412 can be formed by a sputtering method, a CVD method, an MOCVD method, a PECVD method, an MBE method, an ALD method, or a PLD method. It is preferable to use an MOCVD method or an ALD method in order to reduce plasma damage.

Next, third heat treatment may be performed. The third heat treatment can be performed under conditions similar to those of the first heat treatment. The third heat treatment allows reducing oxygen vacancies in the oxide semiconductor layer 404 in some cases.

Through the above steps, the transistor illustrated in FIGS. 3A to 3C can be manufactured.

Modification Example 1

Figure 6A:
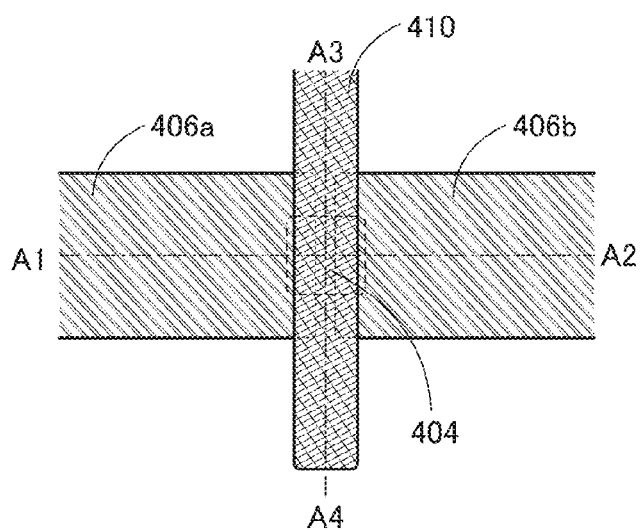
FIGS. 6A and 6B are a top view and a cross-sectional view illustrating a transistor.
Figure 6B:
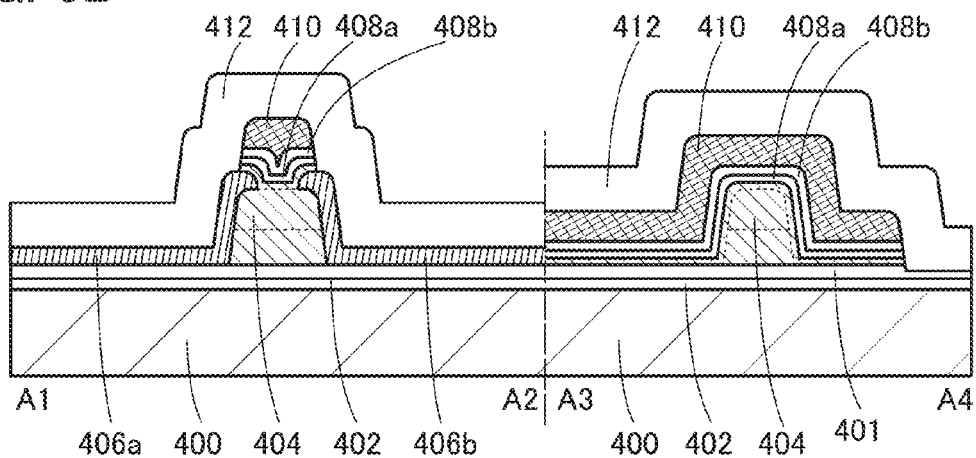

As in a transistor illustrated in FIGS. 6A and 6B, an insulating film 401 can be provided between the base insulating film 402 and the oxide semiconductor layer 404. As the insulating film 401, an insulating film that can be used as the gate insulating film 408a can be used. Note that the description of the transistor illustrated in FIGS. 3A to 3C is referred to for the structures of the other components.

Modification Example 2

Figure 7A:
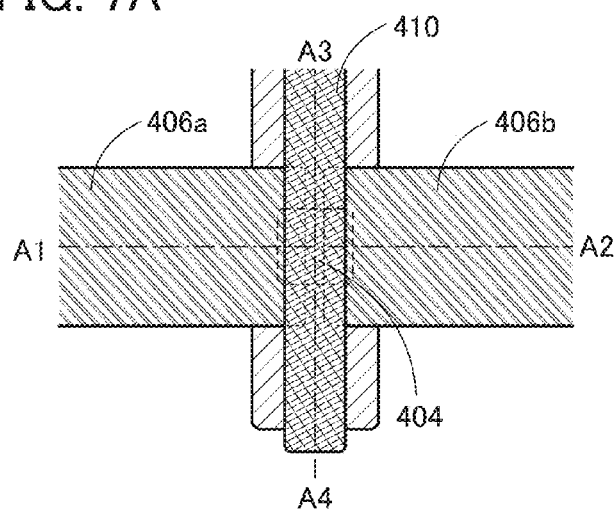
FIGS. 7A and 7B are a top view and a cross-sectional view illustrating a transistor.
Figure 7B:
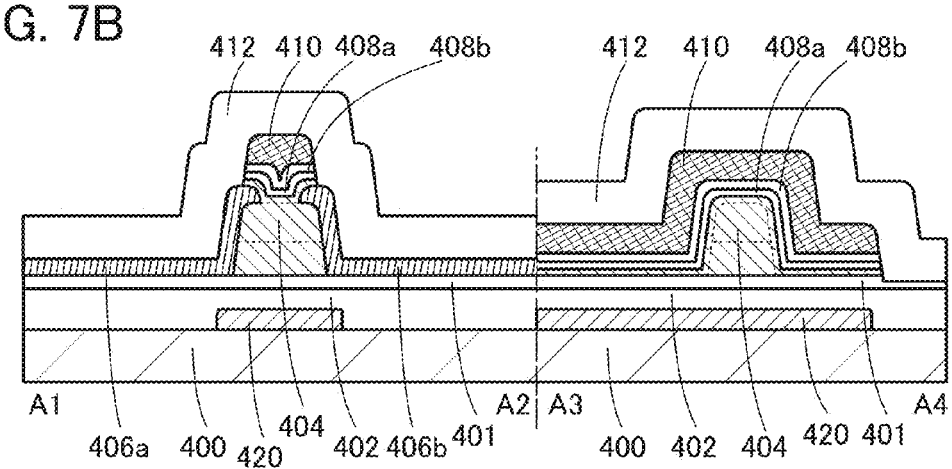

As in a transistor illustrated in FIGS. 7A and 7B, a conductive film 420 can be provided between the substrate 400 and the base insulating film 402. When the conductive film 420 is used as a second gate electrode, the on-state current can be further increased or the threshold voltage can be controlled. To increase the on-state current, for example, the gate electrode 410 and the conductive film 420 are set to have the same potential, and the transistor is driven as a dual-gate transistor. Note that the gate electrode 410 and the conductive film 420 may be electrically connected to each other to have the same potential. To control the threshold voltage, the gate electrode 410 and the conductive film 420 may be supplied with different fixed potentials.

<Transistor Structure 2>

Figure 8A:
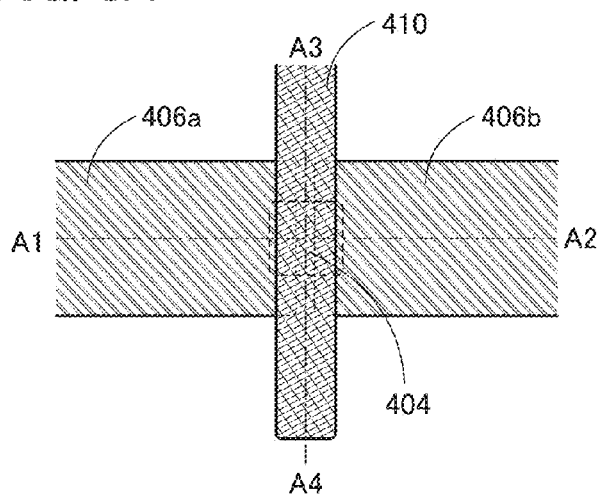
FIGS. 8A to 8C are a top view and cross-sectional views illustrating a transistor.
Figure 8B:
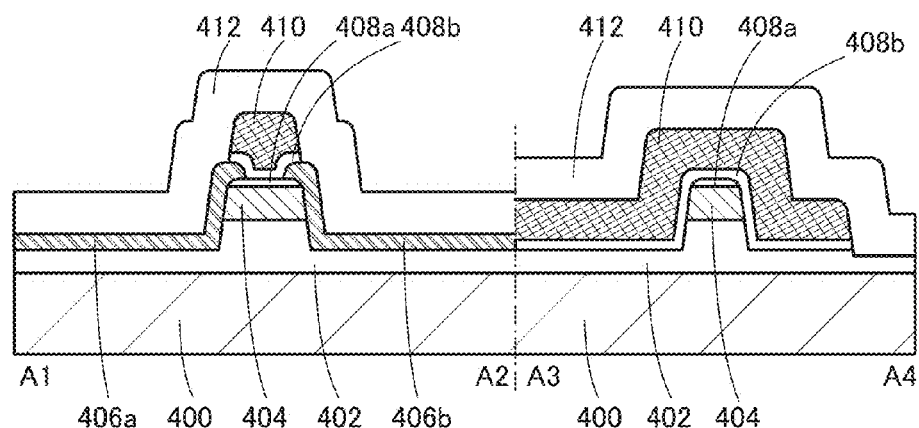

FIGS. 8A and 8B are a top view and a cross-sectional view of a transistor. FIG. 8A is a top view and FIG. 8B is a cross-sectional view taken along dashed-dotted line A1-A2 and dashed-dotted line A3-A4 in FIG. 8A. Note that for simplification of the drawing, some components in the top view in FIG. 8A are not illustrated.

The transistor illustrated in FIGS. 8A and 8B includes the base insulating film 402 having a projecting portion over the substrate 400; the oxide semiconductor layer 404 over the projecting portion of the base insulating film 402; the gate insulating film 408a over the oxide semiconductor layer 404; the source electrode 406a and the drain electrode 406b in contact with side surfaces of the oxide semiconductor layer 404 and the gate insulating film 408a and the top surface of the gate insulating film 408a; the gate insulating film 408b over the gate insulating film 408a, the source electrode 406a, and the drain electrode 406b; the gate electrode 410 that is in contact with the top surface of the gate insulating film 408b and faces the top surface and a side surface of the oxide semiconductor film 404b of the oxide semiconductor layer 404; and the insulating film 412 over the source electrode 406a, the drain electrode 406b, and the gate electrode 410. The base insulating film 402 does not need to include a projecting portion. Note that as illustrated in FIG. 8C, the oxide semiconductor layer 404 includes the oxide semiconductor film 404a, the oxide semiconductor film 404b, and the oxide semiconductor film 404c.

Figure 8C:
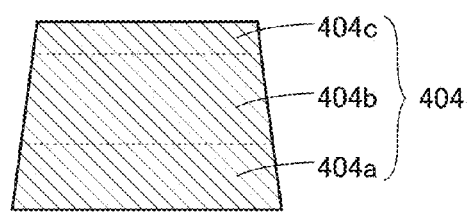

In the transistor illustrated in FIGS. 8A to 8C, the source electrode 406a or the drain electrode 406b are provided to be in contact with mainly side surfaces of the oxide semiconductor layer 404. Therefore, an electric field applied from the gate electrode 410 to the oxide semiconductor layer 404 is less likely to be prevented by the source electrode 406a and the drain electrode 406b. Thus, the current path in the oxide semiconductor layer can be wider than that in the transistors illustrated in FIGS. 3A to 3C, FIGS. 6A and 6B, and FIGS. 7A and 7B, and a higher on-state current can be obtained.

<Transistor Structure 3>

Figure 9A:
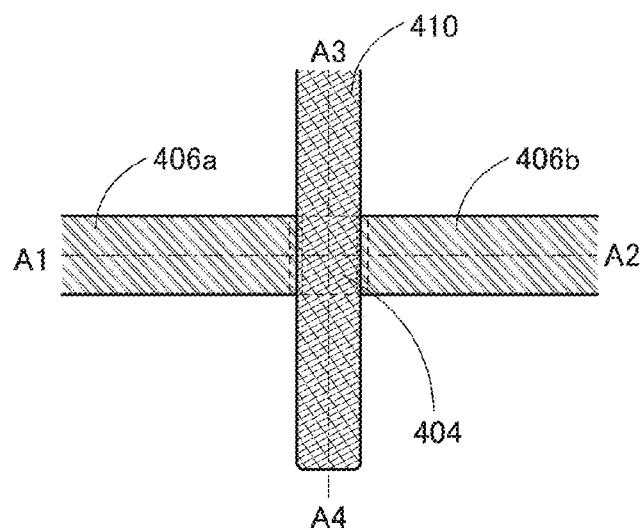
FIGS. 9A and 9B are a top view and a cross-sectional view illustrating a transistor.
Figure 9B:
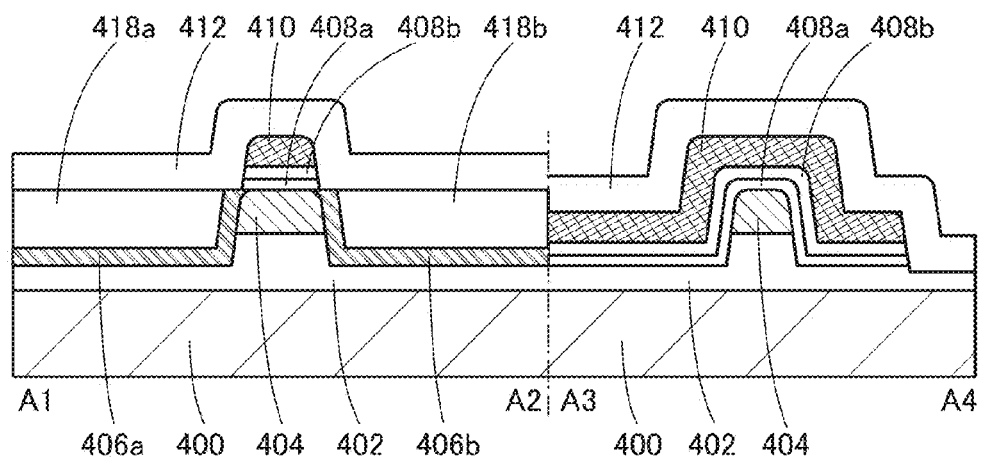

FIGS. 9A and 9B are a top view and a cross-sectional view of a transistor. FIG. 9A is a top view and FIG. 9B is a cross-sectional view taken along dashed-dotted line A1-A2 and dashed-dotted line A3-A4 in FIG. 9A. Note that for simplification of the drawing, some components in the top view in FIG. 9A are not illustrated.

The transistor illustrated in FIGS. 9A and 9B includes the base insulating film 402 having a projecting portion over the substrate 400; the oxide semiconductor layer 404 over the projecting portion of the base insulating film 402; the source electrode 406a and the drain electrode 406b in contact with side surfaces of the oxide semiconductor layer 404; an insulating film 418a and an insulating film 418b over the source electrode 406a and the drain electrode 406b; the gate insulating film 408a over the oxide semiconductor layer 404, the source electrode 406a, and the drain electrode 406b; the gate insulating film 408b over the gate insulating film 408a; the gate electrode 410 that is in contact with the top surface of the gate insulating film 408b and faces the top surface and side surfaces of the oxide semiconductor film 404; and the insulating film 412 over the source electrode 406a, the drain electrode 406b, and the gate electrode 410. The levels of the top surfaces of the insulating films 418a and 418b are the same as the level of the top surface of the oxide semiconductor layer 404. The base insulating film 402 does not need to include a projecting portion. Note that the oxide semiconductor layer 404 has a structure similar to that described in Transistor Structure 2.

In the transistor illustrated in FIGS. 9A and 9B, the source electrode 406a or the drain electrode 406b are provided to be in contact with mainly side surfaces of the oxide semiconductor layer 404. Therefore, an electric field applied from the gate electrode 410 to the oxide semiconductor layer 404 is less likely to be prevented by the source electrode 406a and the drain electrode 406b. Thus, the current path in the oxide semiconductor layer can be wider than that in the transistors illustrated in FIGS. 3A to 3C, FIGS. 6A and 6B, and FIGS. 7A and 7B, and a higher on-state current can be obtained.

Furthermore, since the level of the top surface of the oxide semiconductor layer 404, that of the insulating film 418a, and that of the insulating film 418b are the same, shape defects do not easily occur. Therefore, a semiconductor device including the transistor can be manufactured with high yield.

Note that for the insulating film 418a and the insulating film 418b, refer to the description of the base insulating film 402.

<Transistor Structure 4>

Figure 10A:
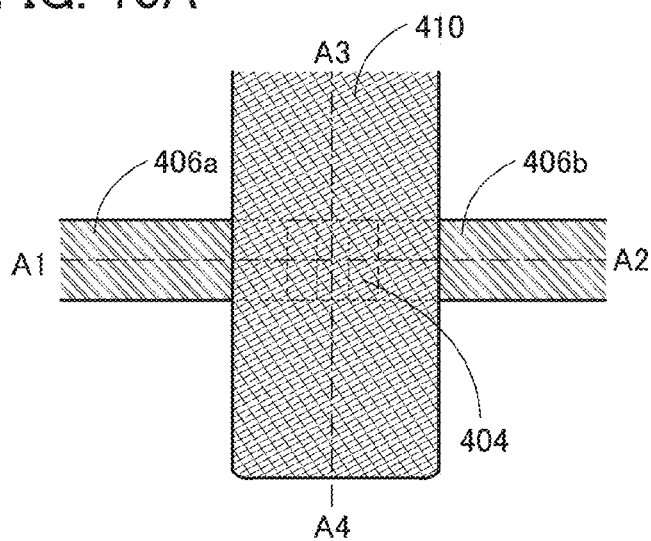
FIGS. 10A and 10B are a top view and a cross-sectional view illustrating a transistor.
Figure 10B:
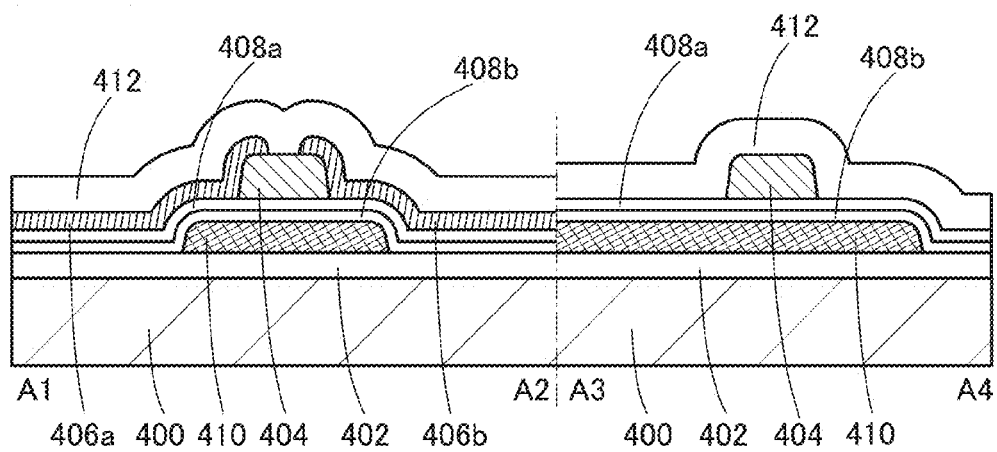

In Transistor Structures 1 to 3, a top gate structure is employed; however, a bottom gate structure can also be employed. FIGS. 10A and 10B are a top view and a cross-sectional view of a transistor with a bottom gate structure. FIG. 10A is a top view and FIG. 10B is a cross-sectional view taken along dashed-dotted line A1-A2 and dashed-dotted line A3-A4 in FIG. 10A. Note that for simplification of the drawing, some components are not illustrated in the top view in FIG. 10A.

The transistor illustrated in FIGS. 10A and 10B includes the base insulating film 402 over the substrate 400; the gate electrode 410 over the base insulating film 402; the gate insulating film 408b over the base insulating film 402 and the gate electrode 410; the gate insulating film 408a over the gate insulating film 408b; the oxide semiconductor layer 404 over the gate insulating film 408a; the source electrode 406a and the drain electrode 406b in contact with the top surface of the gate insulating film 408a and the top surface and a side surface of the oxide semiconductor layer 404; and the insulating film 412 over the oxide semiconductor layer 404, the source electrode 406a, and the drain electrode 406b. Note that the oxide semiconductor layer 404 has a structure similar to that described in Transistor Structure 2.

Figure 11A:
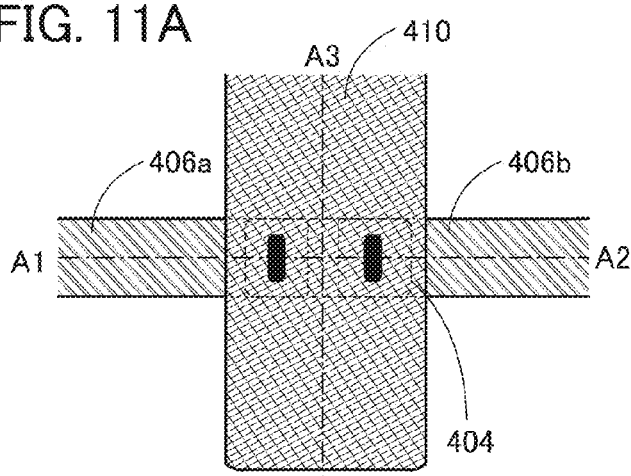
FIGS. 11A to 11C are a top view and cross-sectional views illustrating a transistor.
Figure 11B:
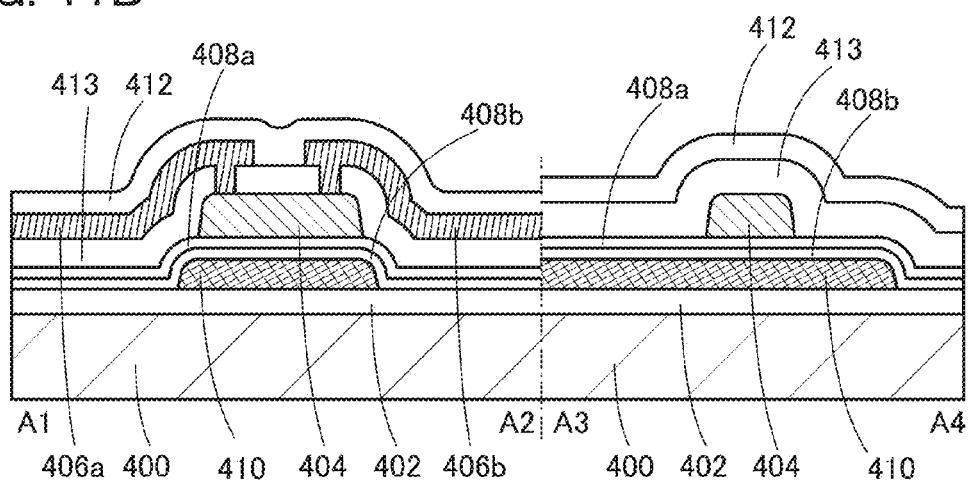
Figure 11C:
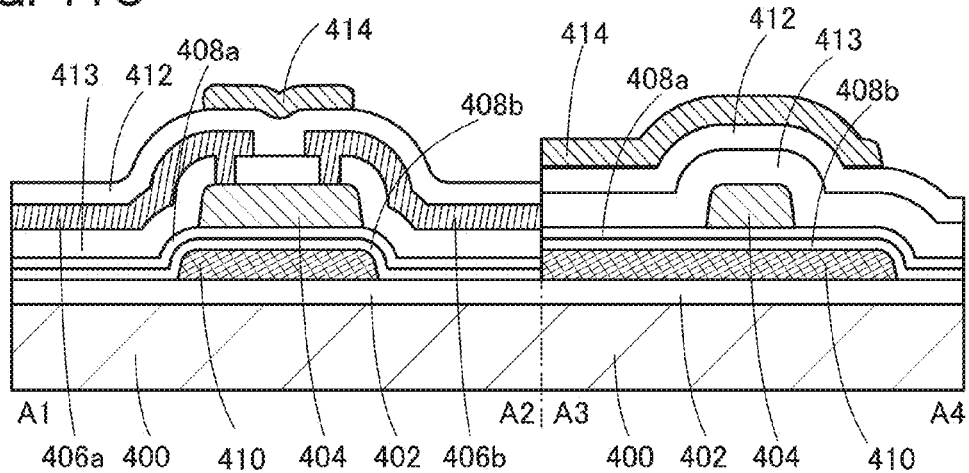

Note that as illustrated in FIGS. 11A and 11B, an insulating film 413 may be provided between the oxide semiconductor layer 404 and each of the source electrode 406a and the drain electrode 406b. In that case, the oxide semiconductor layer 404 is connected to the source electrode 406a and the drain electrode 406b through opening portions provided in the insulating film 413. Furthermore, a conductive film 414 may be provided over the insulating film 412 as illustrated in FIG. 11C. The conductive film 414 can function as a back gate. The conductive film 414 may be connected to the gate electrode 410. Alternatively, the conductive film 414 and the gate electrode 410 may be supplied with different signals or different potentials. Although the insulating film 413 is also provided in a region where the oxide semiconductor layer 404 is not provided, one embodiment of the present invention is not limited thereto; the insulating film 413 may be provided only over the oxide semiconductor layer 404.

Although an example where a channel or the like is formed in an oxide semiconductor layer is described in this embodiment, one embodiment of the present invention is not limited thereto. For example, depending on cases or conditions, a channel, the vicinity of the channel, a source region, a drain region, or the like may be formed using a material containing Si (silicon), Ge (germanium), SiGe (silicon germanium), GaAs (gallium arsenide), or the like.

The structures, methods, and the like described in this embodiment can be combined as appropriate with any of the structures, methods, and the like described in the other embodiments.

Embodiment 3

In this embodiment, an example of a circuit including the transistor of one embodiment of the present invention is described with reference to drawings.

[Cross-Sectional Structure]

Figure 12A:
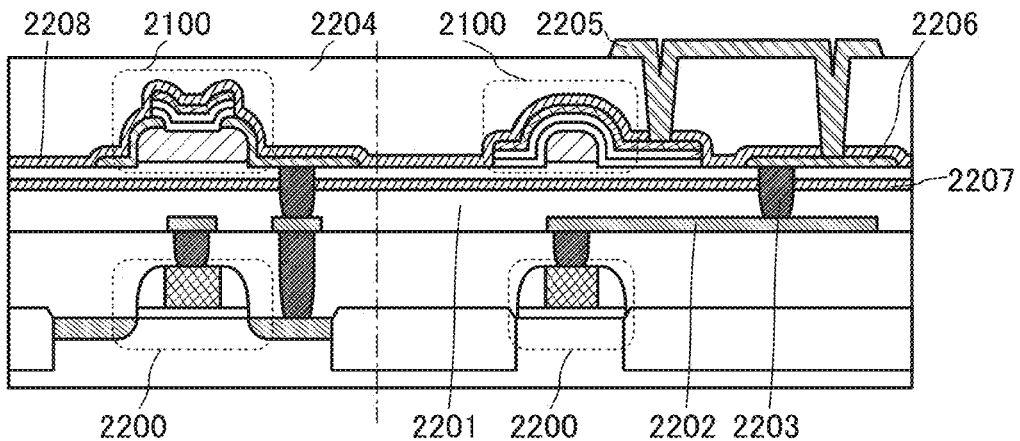
FIGS. 12A to 12D are cross-sectional views and circuit diagrams of semiconductor devices of one embodiment.

FIG. 12A is a cross-sectional view of a semiconductor device of one embodiment of the present invention. The semiconductor device illustrated in FIG. 12A includes a transistor 2200 containing a first semiconductor material in a lower portion and a transistor 2100 containing a second semiconductor material in an upper portion. In FIG. 12A, an example is described in which the transistor described in the above embodiment as an example is used as the transistor 2100 containing the second semiconductor material.

Here, the first semiconductor material and the second semiconductor material are preferably materials having different band gaps. For example, the first semiconductor material can be a semiconductor material (such as silicon, germanium, silicon germanium, silicon carbide, or gallium arsenide) other than an oxide semiconductor, and the second semiconductor material can be an oxide semiconductor. A transistor using a material other than an oxide semiconductor, such as single crystal silicon, can operate at high speed easily. In contrast, a transistor using an oxide semiconductor has low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, does not need to be limited to those described here except for the use of the transistor of one embodiment of the present invention which uses an oxide semiconductor.

FIG. 12A illustrates a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of plugs 2203 embedded in the insulating films. An insulating film 2204 covering the transistor 2100, a wiring 2205 over the insulating film 2204, and a wiring 2206 formed by processing a conductive film that is also used for a pair of electrodes of the transistor 2100 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor layer of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 also can be improved.

The insulating film 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, an insulating film 2208 having a function of preventing diffusion of hydrogen is preferably formed over the transistor 2100 to cover the transistor 2100 including an oxide semiconductor layer. For the insulating film 2208, a material that is similar to that of the insulating film 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the insulating film 2208 covering the transistor 2100, release of oxygen from the oxide semiconductor layer included in the transistor 2100 can be prevented and entry of water and hydrogen into the oxide semiconductor layer can be prevented.

Note that the transistor 2200 can be a transistor of various types without being limited to a planar type transistor. For example, a FIN-type transistor, a TRI-GATE transistor, or the like can be used. An example of a cross-sectional view in this case is shown in FIG. 12D. An insulating film 2212 is provided over a semiconductor substrate 2211. The semiconductor substrate 2211 includes a projecting portion with a thin tip (also referred to a fin). Note that an insulating film may be provided over the projecting portion. The insulating film functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulating film 2214 is provided over the projecting portion of the semiconductor substrate 2211, and a gate electrode 2213 is provided over the gate insulating film 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

[Circuit Configuration Example]

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

<CMOS Circuit>

Figure 12B:
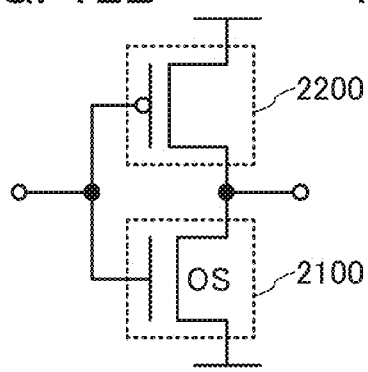

A circuit diagram in FIG. 12B shows a configuration of a "CMOS circuit" in which the p-channel transistor 2200 and the n-channel transistor 2100 are connected in series and in which gates of them are connected to each other.

<CMOS Analog Switch>

Figure 12C:
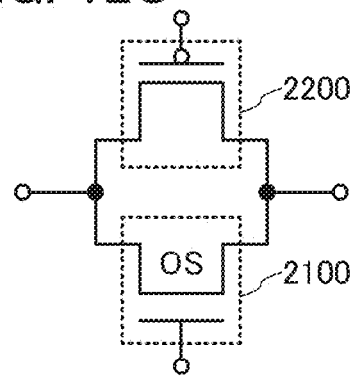
Figure 12D:
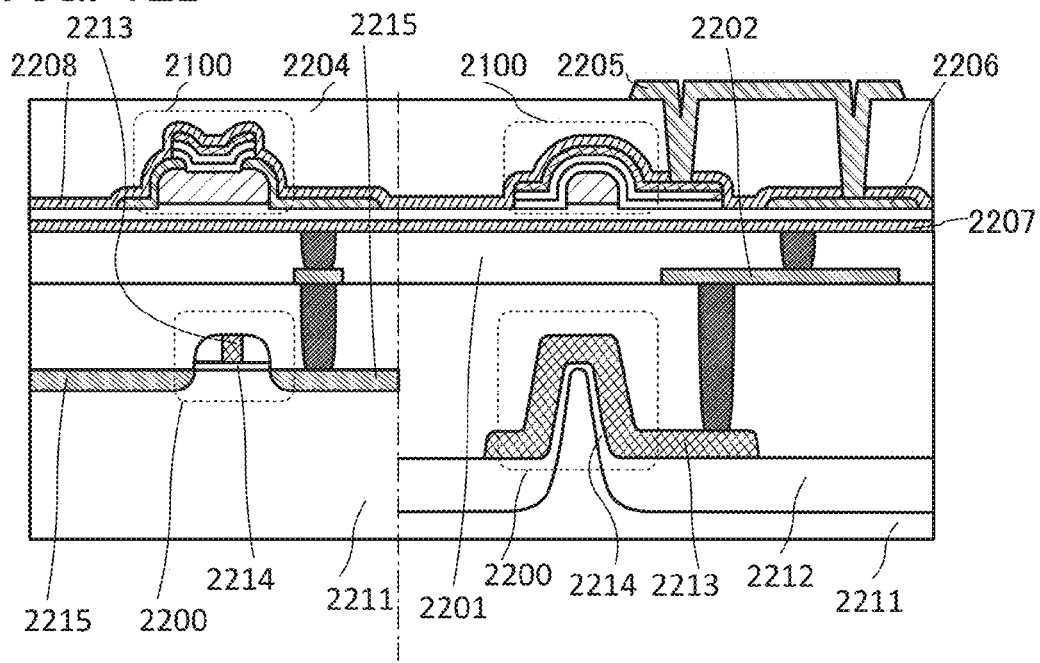

A circuit diagram in FIG. 12C shows a configuration in which a source and a drain of the transistor 2100 are connected to a source and a drain of the transistor 2200. With such a configuration, the transistors can function as what is called an analog switch <Memory Device Example>

Figure 13A:
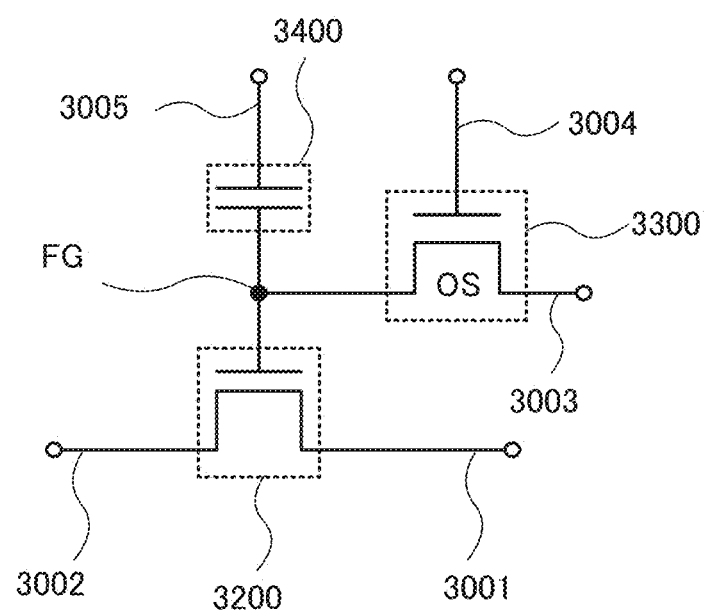
FIGS. 13A and 13B each illustrate a structure example of a storage device of one embodiment.
Figure 13B:
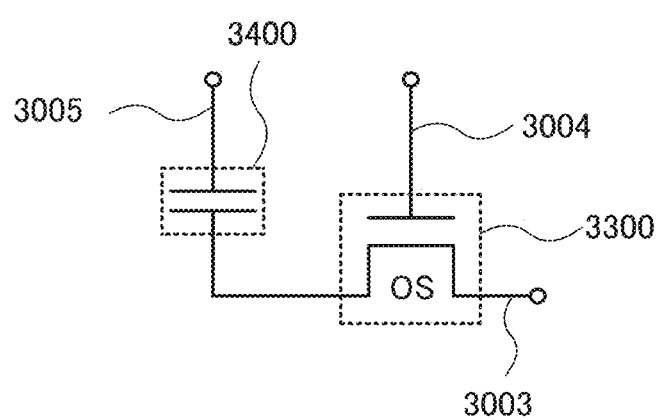

An example of a semiconductor device (memory device) which includes the transistor of one embodiment of the present invention, which can retain stored data even when not powered, and which has an unlimited number of write cycles is shown in FIGS. 13A and 13B.

The semiconductor device illustrated in FIG. 13A includes a transistor 3200 using a first semiconductor material, a transistor 3300 using a second semiconductor material, and a capacitor 3400. Note that any of the above-described transistors can be used as the transistor 3300.

The transistor 3300 is a transistor in which a channel is formed in a semiconductor layer including an oxide semiconductor. Since the off-state current of the transistor 3300 is low, stored data can be retained for a long period. In other words, power consumption can be sufficiently reduced because a semiconductor device in which refresh operation is unnecessary or the frequency of refresh operation is extremely low can be provided.

In FIG. 13A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 13A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in general, in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. On the other hand, in the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell be read. In the case where such reading is not performed, the fifth wiring 3005 may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

The semiconductor device illustrated in FIG. 13B is different from the semiconductor device illustrated in FIG. 13A in that the transistor 3200 is not provided. Also in this case, writing and retaining operation of data can be performed in a manner similar to the above.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ $((C_B \times V_{B0} + C \times V_1)/(C_B + C))$ is higher than the potential of the third wiring 3003 in the case of retaining the potential $V_0 ((C_B \times V_{B0} + C \times V_0)/(C_B + C))$.

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The structures, methods, and the like described in this embodiment can be combined as appropriate with any of the structures, methods, and the like described in the other embodiments.

Embodiment 4

In this embodiment, an RF tag that includes the transistor described in the above embodiments or the memory device described in the above embodiment is described with reference to FIG. 14.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 14. FIG. 14 is a block diagram illustrating a configuration example of an RF tag.

Figure 14:
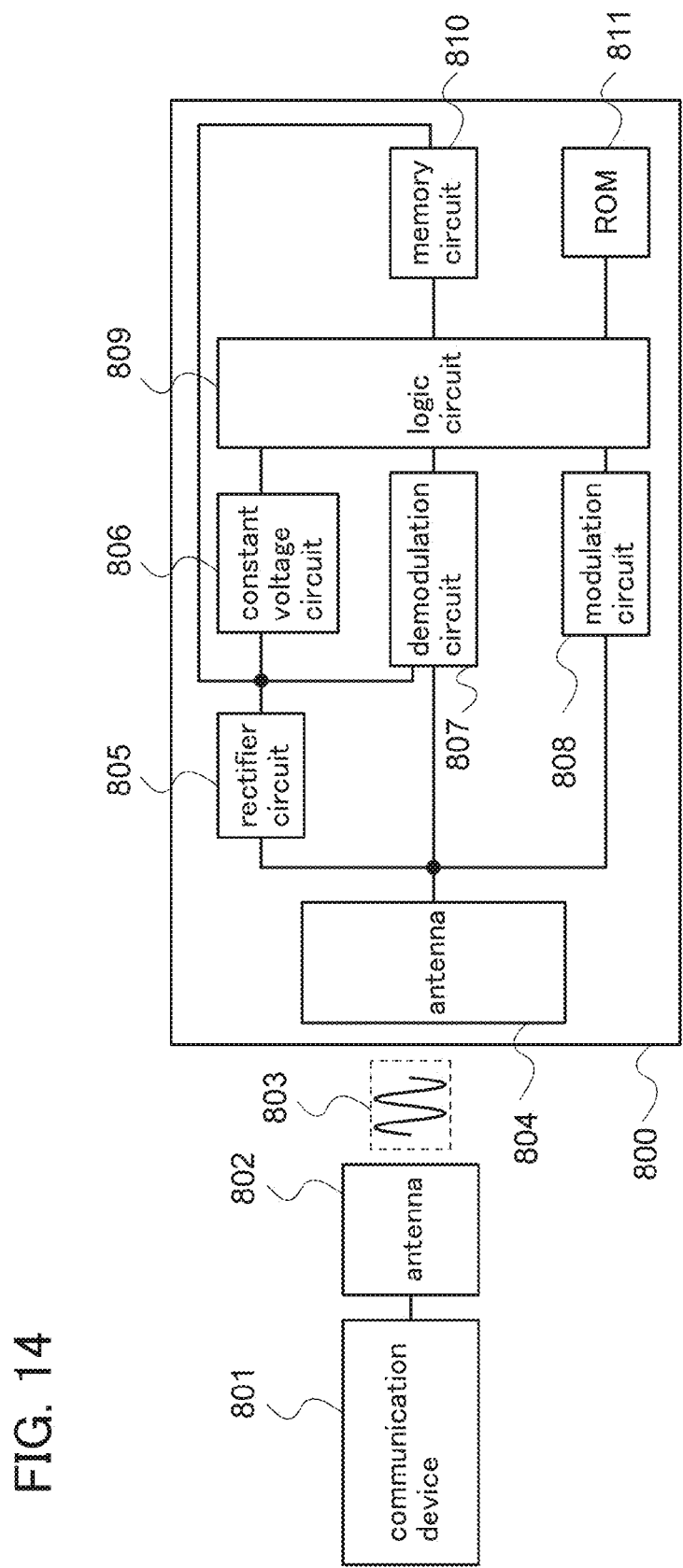
FIG. 14 illustrates a structural example of an RF tag of one embodiment.

As shown in FIG. 14, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

Embodiment 5

In this embodiment, a CPU in which at least the transistor described in any of the above embodiments can be used and the memory device described in the above embodiment is included is described.

Figure 15:
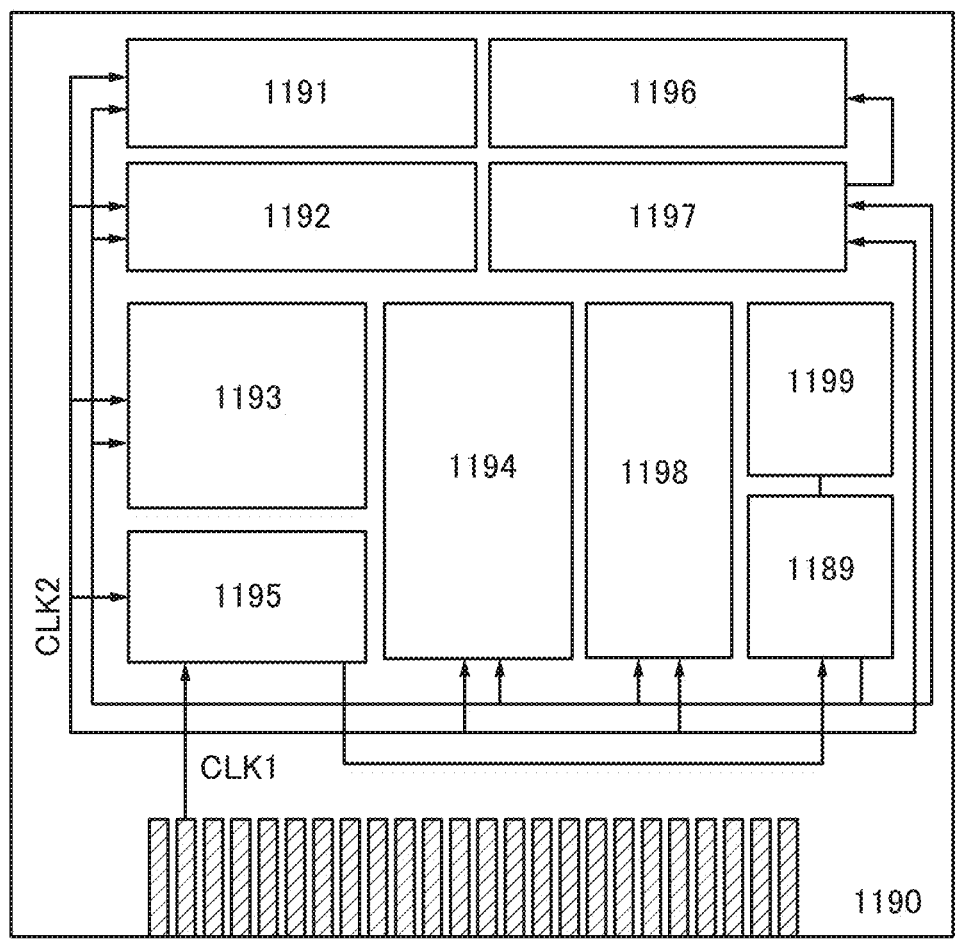
FIG. 15 illustrates a structural example of a CPU of one embodiment.

FIG. 15 is a block diagram illustrating a configuration example of a CPU at least partly including any of the transistors described in the above embodiments as a component.

The CPU illustrated in FIG. 15 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 15 is just an example in which the configuration has been simplified, and an actual CPU may have a variety of configurations depending on the application. For example, the CPU may have the following configuration: a structure including the CPU illustrated in FIG. 15 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 15, a memory cell is provided in the register 1196. For the memory cell of the register 1196, any of the transistors described in the above embodiments can be used.

In the CPU illustrated in FIG. 15, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 16:
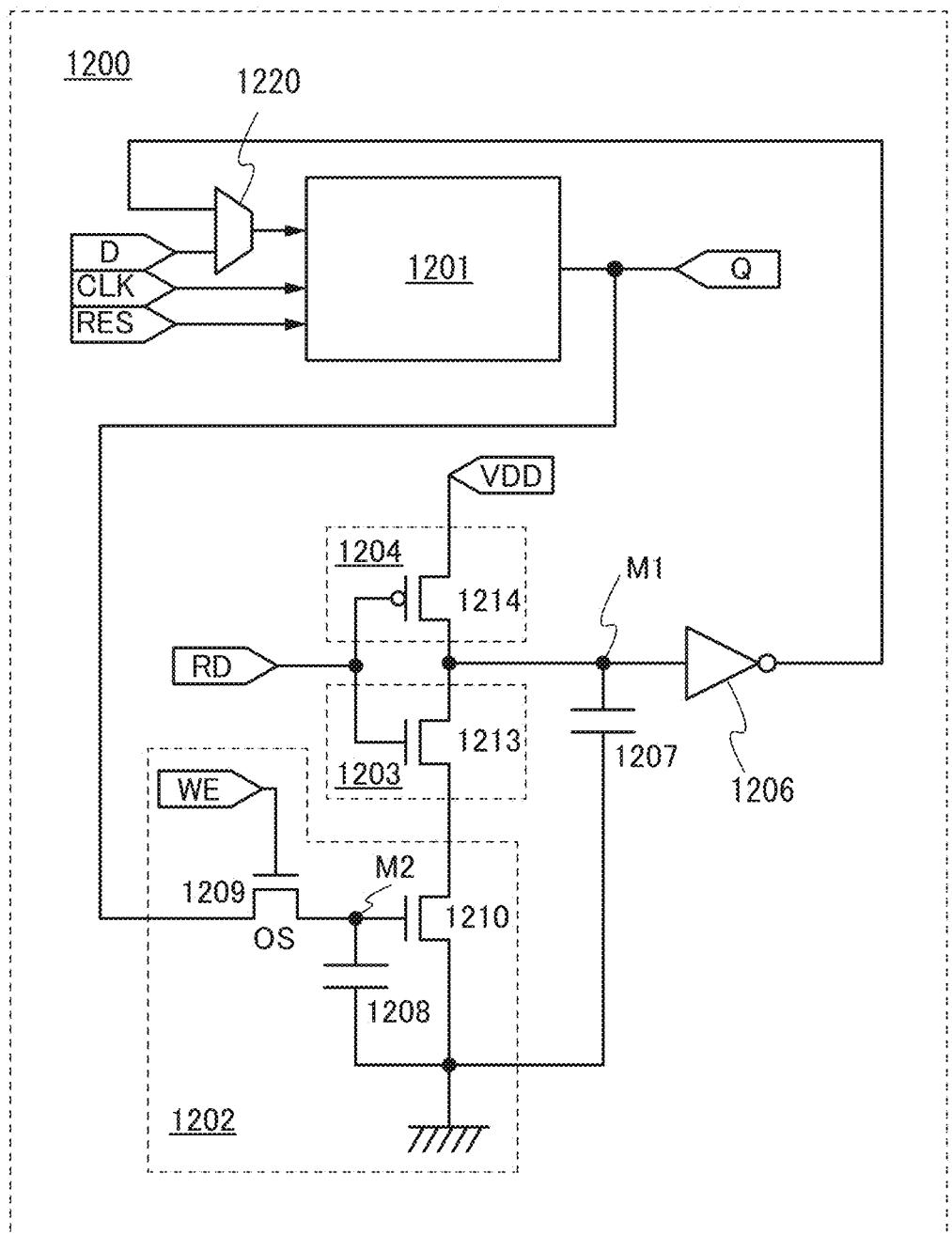
FIG. 16 is a circuit diagram of a storage element of one embodiment.

FIG. 16 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 do not need to be provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 16 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 16, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 16, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 16, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs precharge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency (RF) device.

Embodiment 6

In this embodiment, a structure example of a display device of one embodiment of the present invention is described.
[Structure Example]

Figure 17A:
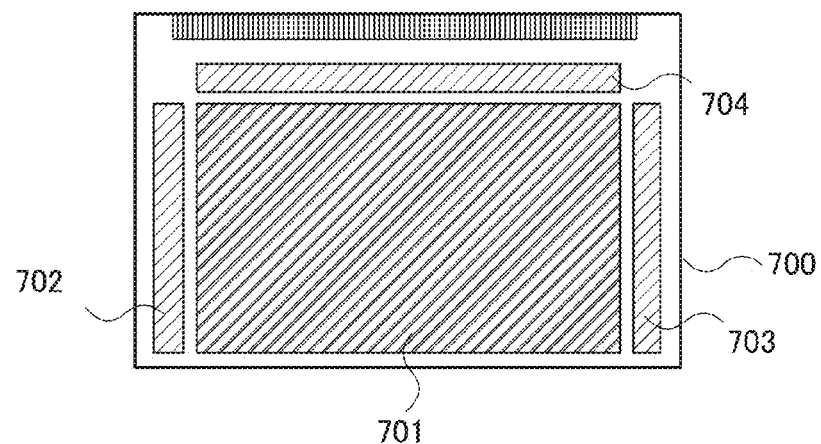
FIGS. 17A to 17C each illustrate a display device of one embodiment.
Figure 17B:
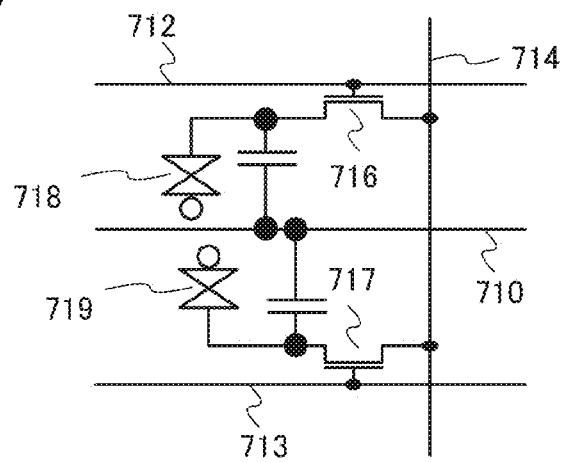
Figure 17C:
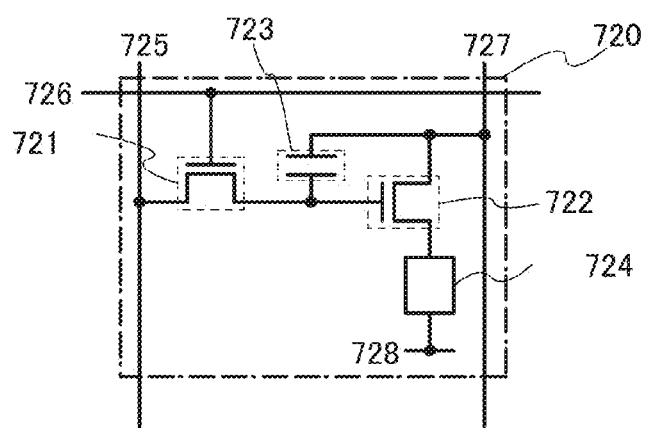

FIG. 17A is a top view of the display device of one embodiment of the present invention. FIG. 17B is a circuit diagram illustrating a pixel circuit that can be used in the case where a liquid crystal element is used in a pixel in the display device of one embodiment of the present invention. FIG. 17C is a circuit diagram illustrating a pixel circuit that can be used in the case where an organic EL element is used in a pixel in the display device of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 17A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels that include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 17A, the first scan line driver circuit 702, the second scan line driver circuit 703, and the signal line driver circuit 704 are formed over the substrate 700 where the pixel portion 701 is formed. Accordingly, the number of components that are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.
<Liquid Crystal Display Device>

FIG. 17B illustrates an example of a circuit configuration of the pixel. Here, a pixel circuit that can be used in a pixel of a VA liquid crystal display device is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor described in any of the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer is spread in a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 17B. For example, a switch, a resistor, a capacitor, a transistor, a sensor, a logic circuit, or the like may be added to the pixel illustrated in FIG. 17B.

<Organic EL Display Device>

FIG. 17C illustrates another example of a circuit configuration of the pixel. Here, a pixel structure of a display device including an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 17C illustrates an applicable example of a pixel circuit. Here, one pixel includes two n-channel transistors. Note that a metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of the above embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 17C. For example, a switch, a resistor, a capacitor, a sensor, a transistor, a logic circuit, or the like may be added to the pixel circuit illustrated in FIG. 17C.

In the case where the transistor shown in any of the above embodiments is used for the circuit shown in FIGS. 17A to 17C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an electroluminescent (EL) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper.

At least part of this embodiment can be implemented in combination with any of the other embodiments described in this specification as appropriate.

Embodiment 7

In this embodiment, a display module using a semiconductor device of one embodiment of the present invention will be described with reference to FIG. 18.

Figure 18:
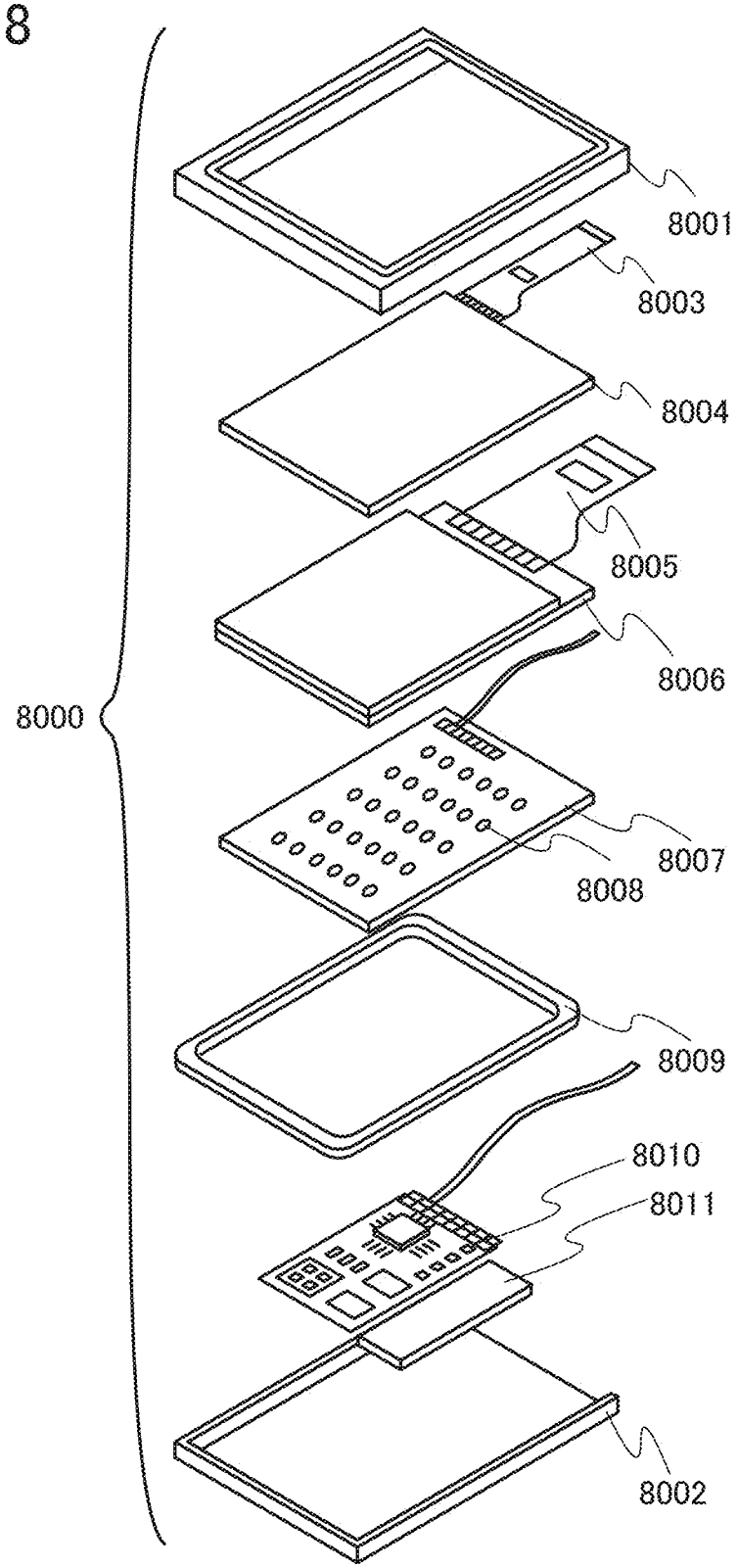
FIG. 18 illustrates a display module.

In a display module 8000 in FIG. 18, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. A counter substrate (sealing substrate) of the display panel 8006 can have a touch panel function. A photosensor may be provided in each pixel of the display panel 8006 so that an optical touch panel is obtained. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet.

The structures described in this embodiment can be used as appropriate in combination with any of the structures described in the other embodiments.

Embodiment 8

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 19A to 19F illustrate specific examples of these electronic devices.

Figure 19A:
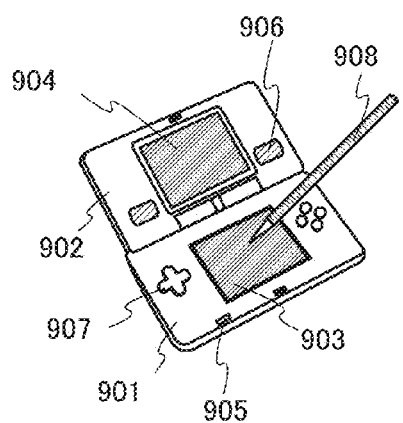
FIGS. 19A to 19F illustrate electronic devices of one embodiment.

FIG. 19A illustrates a portable game console including a housing 901, a housing 902, a display portion 903, a display portion 904, a microphone 905, a speaker 906, an operation key 907, a stylus 908, and the like. Although the portable game machine in FIG. 19A has the two display portions 903 and 904, the number of display portions included in a portable game machine is not limited to this.

Figure 19B:
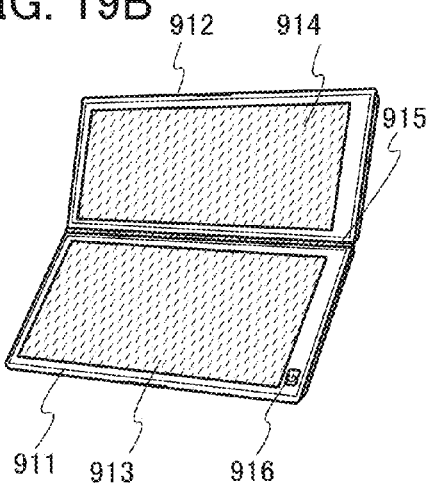

FIG. 19B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 19C:
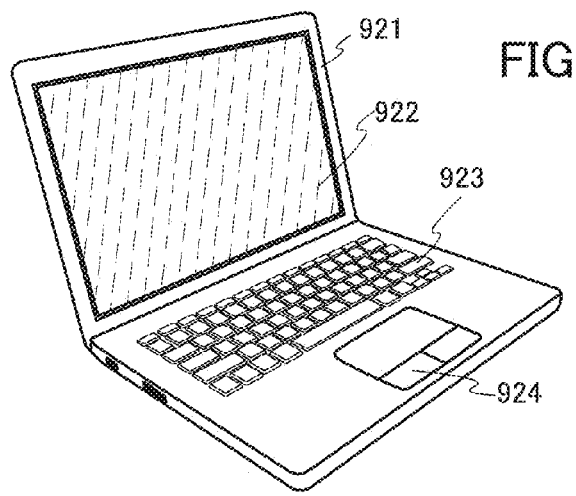

FIG. 19C illustrates a notebook personal computer, which includes a housing 921, a display portion 922, a keyboard 923, a pointing device 924, and the like.

Figure 19D:
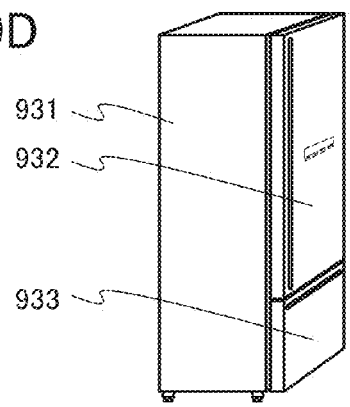

FIG. 19D illustrates an electric refrigerator-freezer including a housing 931, a door for a refrigerator 932, a door for a freezer 933, and the like.

Figure 19E:
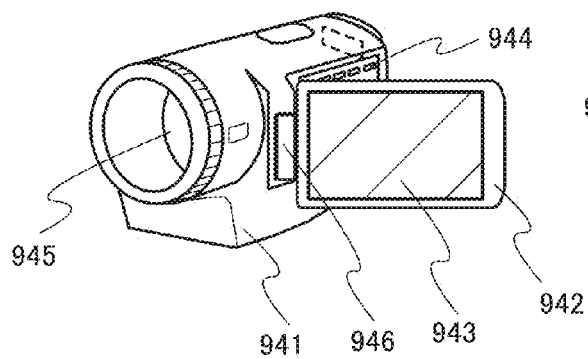

FIG. 19E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 19F:
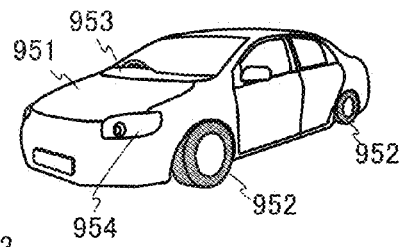
Figure 20A:
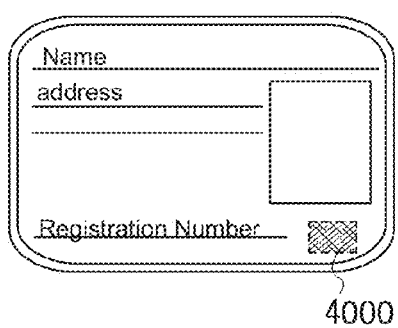
FIGS. 20A to 20F each illustrate an application example of an RF of one embodiment
Figure 20B:
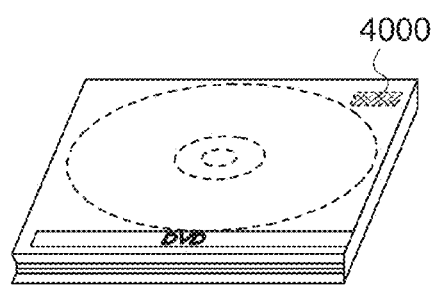
Figure 20C:
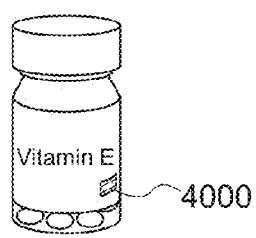
Figure 20D:
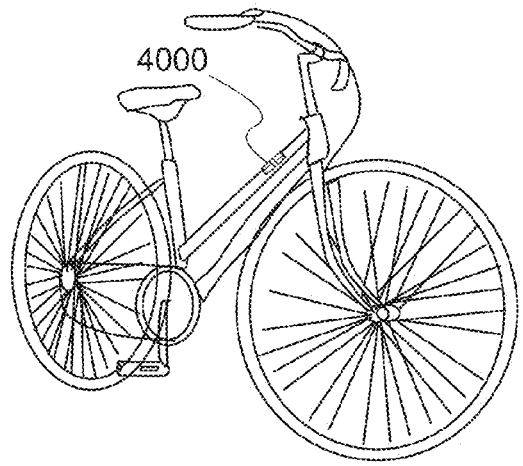
Figure 20E:
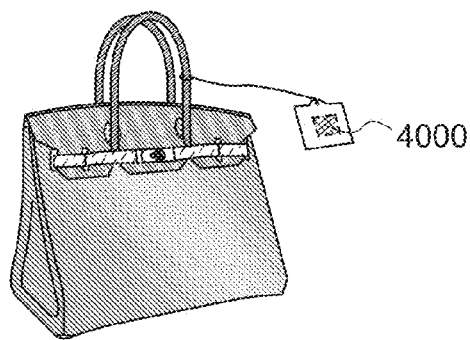
Figure 20F:
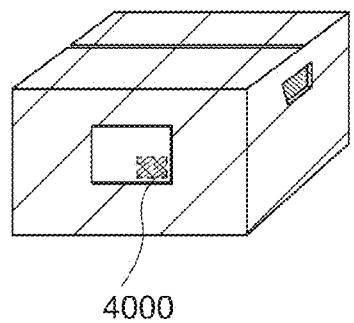

FIG. 19F illustrates an ordinary vehicle including a car body 951, wheels 952, a dashboard 953, lights 954, and the like.

Embodiment 9

In this embodiment, application examples of an RF device of one embodiment of the present invention will be described with reference to FIGS. 20A to 20F. The RF device is widely used and can be provided for, for example, products such as bills, coins, securities, bearer bonds, documents (e.g., driver's licenses or resident's cards, see FIG. 20A), packaging containers (e.g., wrapping paper or bottles, see FIG. 20C), recording media (e.g., DVD or video tapes, see FIG. 20B), vehicles (e.g., bicycles, see FIG. 20D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 20E and 20F).

An RF device 4000 of one embodiment of the present invention is fixed to a product by being attached to a surface thereof or embedded therein. For example, the RF device 4000 is fixed to each product by being embedded in paper of a book, or embedded in an organic resin of a package. Since the RF device 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF device 4000 of one embodiment of the present invention, and the identification function can be utilized to prevent counterfeiting. Moreover, the efficiency of a system such as an inspection system can be improved by providing the RF device of one embodiment of the present invention for packaging containers, recording media, personal belongings, foods, clothing, household goods, electronic devices, or the like. Vehicles can also have higher security against theft or the like by being provided with the RF device of one embodiment of the present invention.

As described above, by using the RF device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF device can be preferably used for application in which data is not frequently written or read.

Example 1

In this example, X-ray diffraction (XRD) measurement was performed on hafnium oxide that can be used for a gate insulating film.

A measurement sample is described.

Over a silicon wafer, a silicon oxynitride film was formed to have a thickness of 5 nm by a PECVD method under the following conditions: silane ($SiH_4$) at a flow rate of 1 sccm and dinitrogen monoxide ($N_2O$) at a flow rate of 800 sccm were used as source gases; pressure in a reaction chamber was 200 Pa; substrate temperature was 350° C.; and a high-frequency power of 150 W was supplied to parallel plate electrodes with a 60 MHz high frequency power source.

Next, a hafnium oxide film was formed to have a thickness of 30 nm over the silicon oxynitride film by a sputtering method under the following conditions: a hafnium oxide target was used; an argon (Ar) gas and/or an oxygen ($O_2$) gas (an argon gas at a flow rate of 50 sccm: 0% oxygen, an argon gas at a flow rate of 25 sccm and an oxygen gas at a flow rate of 25 sccm: 50% oxygen, or an oxygen gas at a flow rate of 50 sccm: 100% oxygen) was used as a deposition gas; pressure was 0.6 Pa; substrate temperature was 100° C. 200° C., or 350° C.; and an RF power of 2.5 kW was applied.

Figure 21:
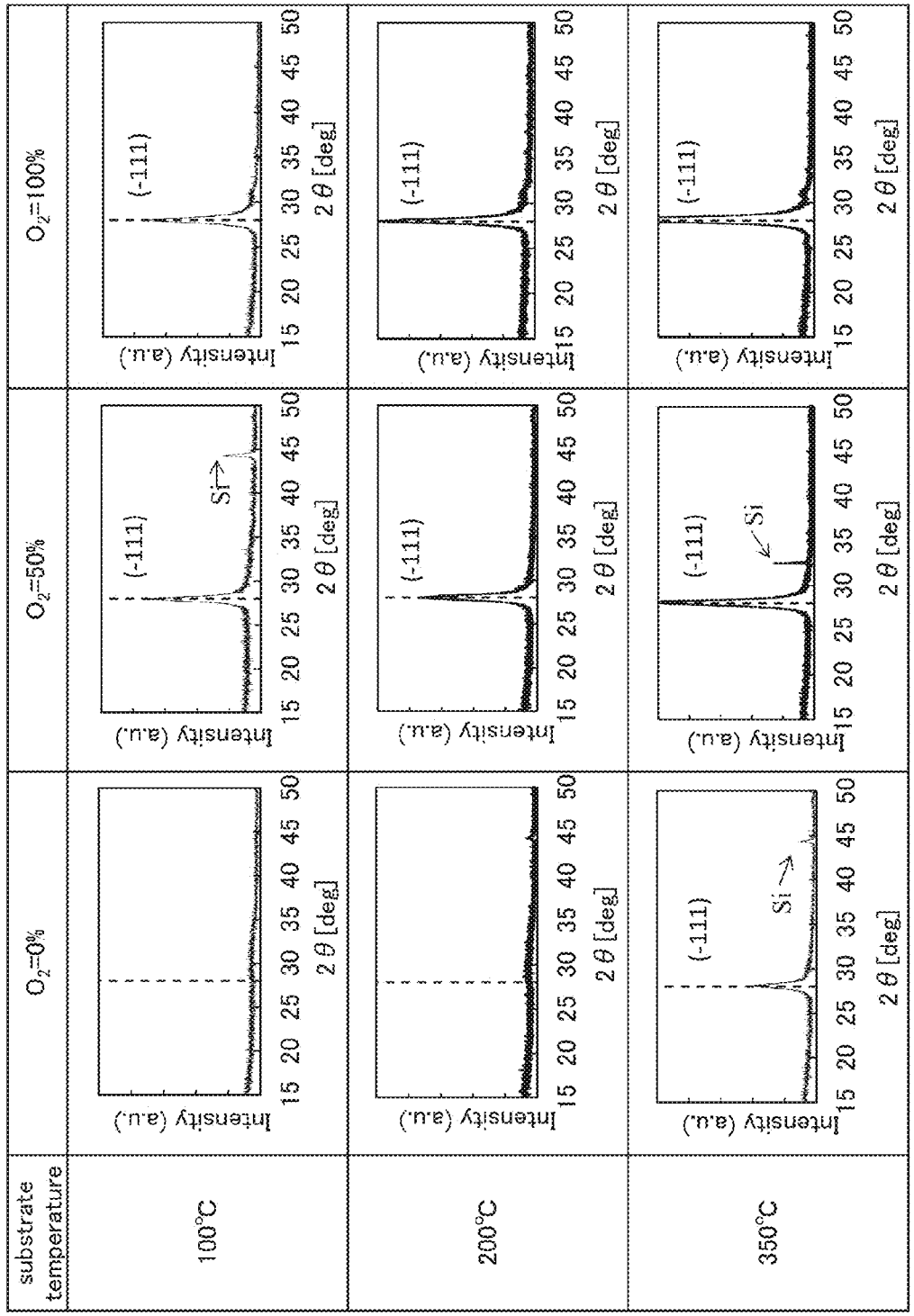
FIG. 21 shows measured XRD spectra.

FIG. 21 shows XRD spectra of the samples measured by an out-of-plane method. In FIG. 21, the longitudinal axis represents X-ray diffraction intensity (arbitrary unit) and the lateral axis represents diffraction angle 2θ (deg.). Note that the XRD spectra were measured with the use of an X-ray diffractometer D8 ADVANCE manufactured by Bruker AXS.

In FIG. 21, a peak that appears at 2θ of around 28° is observed in each of samples under a substrate temperature of 350° C. or 50% or more oxygen. This is due to diffraction of the (−111) plane of a monoclinic crystal of hafnium oxide ($HfO_2$). In addition, a peak assigned to silicon (Si), which is due to the silicon wafer, is also observed in some samples.

As the substrate temperature increases, the peak intensity becomes higher. Furthermore, the peak intensity becomes higher as the proportion of oxygen at the time of deposition of the hafnium oxide film becomes larger. The peak indicates that the hafnium oxide film is crystallized.

Example 2

In this example, electron spin resonance (ESR) measurement was performed on hafnium oxide that can be used for a gate insulating film.

A measurement sample is described.

A hafnium oxide film was formed to have a thickness of 100 nm over a quartz substrate by a sputtering method under the following conditions: a hafnium oxide target was used; an argon (Ar) gas and/or an oxygen ($O_2$) gas (an argon gas at a flow rate of 50 sccm: 0% oxygen, or an argon gas at a flow rate of 25 sccm and an oxygen gas at a flow rate of 25 sccm: 50% oxygen) was used as a deposition gas; pressure was 0.6 Pa; substrate temperature was 100° C., 200° C. or 350° C.; and an RF power of 2.5 kW was applied. After the deposition, some samples were subjected to baking treatment at 300° C., 350° C., or 400° C. in an oxygen atmosphere for one hour.

Note that in the measurement, the hafnium oxide film was perpendicularly irradiated with a microwave (frequency: 9.47 GHz, power: 0.1 mW) at a temperature of 10 K.

Figure 22:
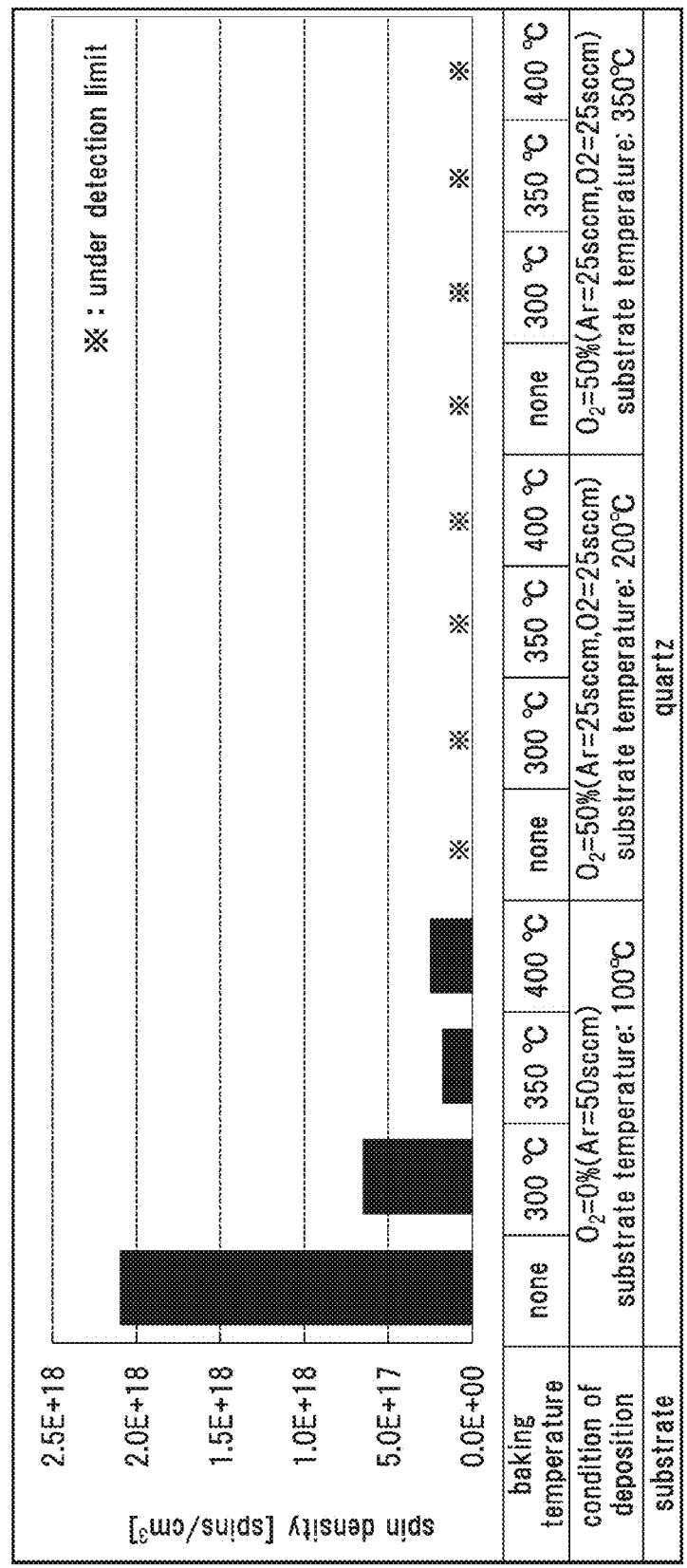
FIG. 22 shows ESR measurement results.

An ESR signal due to oxygen vacancies in hafnium oxide is assumed to appear at a g-factor of 1.92 to 1.98. As shown in FIG. 22, in the hafnium oxide films formed under 0% oxygen, the spin density at a g-factor of around 1.92 is high and is reduced after the baking in an oxygen atmosphere. This suggests that the spin density at a g-factor of around 1.92 is due to oxygen vacancies.

Note that the results of Rutherford backscattering spectrometry (RBS) in Table 1 show that the proportion of oxygen is smaller and the proportion of argon, which seems to have entered at the time of the deposition, is larger in the hafnium oxide film formed under 0% oxygen than in the hafnium oxide film formed under much oxygen (50% oxygen). The film density of the hafnium oxide film is preferably greater than or equal to 8.3 $g/cm^3$ and less than or equal to 9.0 $g/cm^3$.

TABLE 1

| Deposition Conditions | Composition (atomic %) | | | |
|---|---|---|---|---|
| | Hf | O | Ar | Others |
| $O_2$ = 0%, Substrate Temperature: 100° C. | 31.8 | 66.4 | 1.4 | 0.4 |
| $O_2$ = 50%, Substrate Temperature: 200° C. | 31.1 | 68.1 | 0.4 | 0.4 |

Figure 23:
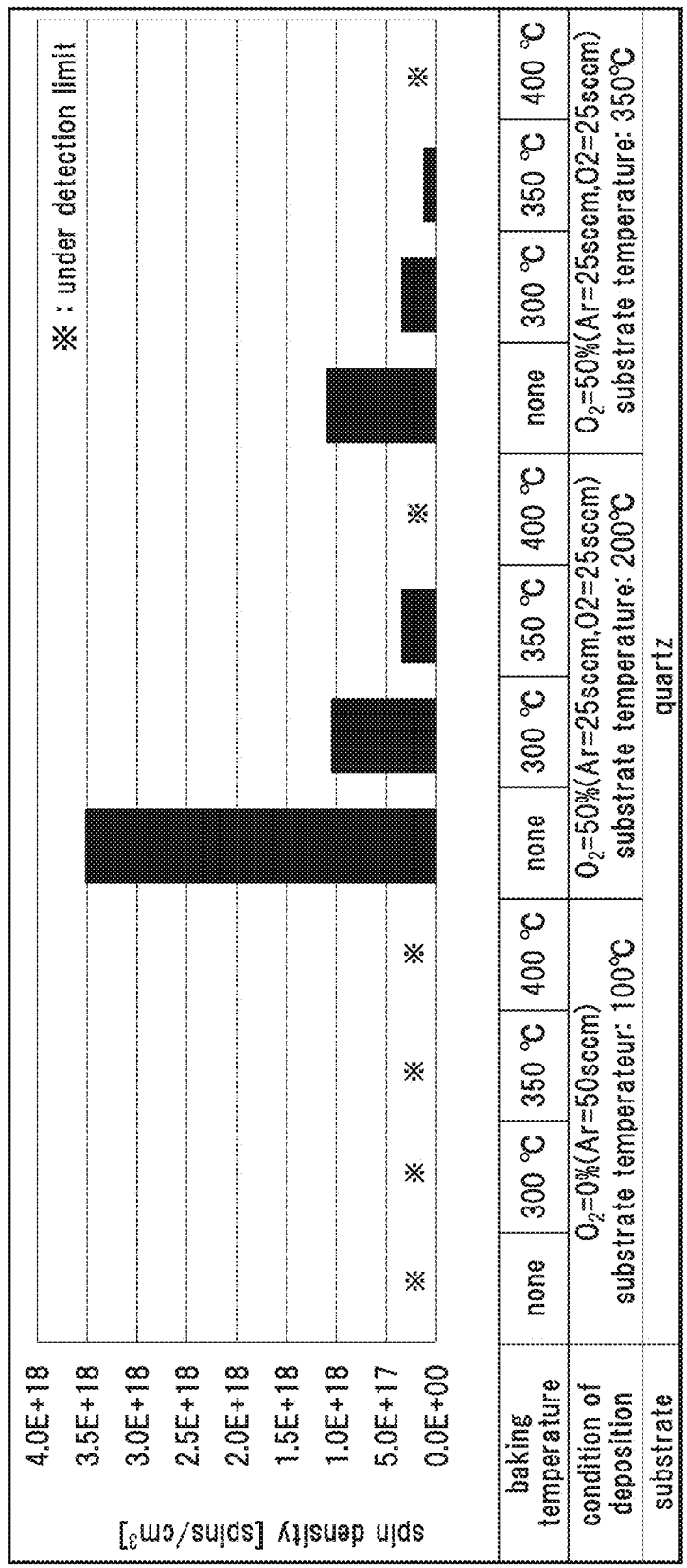
FIG. 23 shows ESR measurement results.
Figure 33:
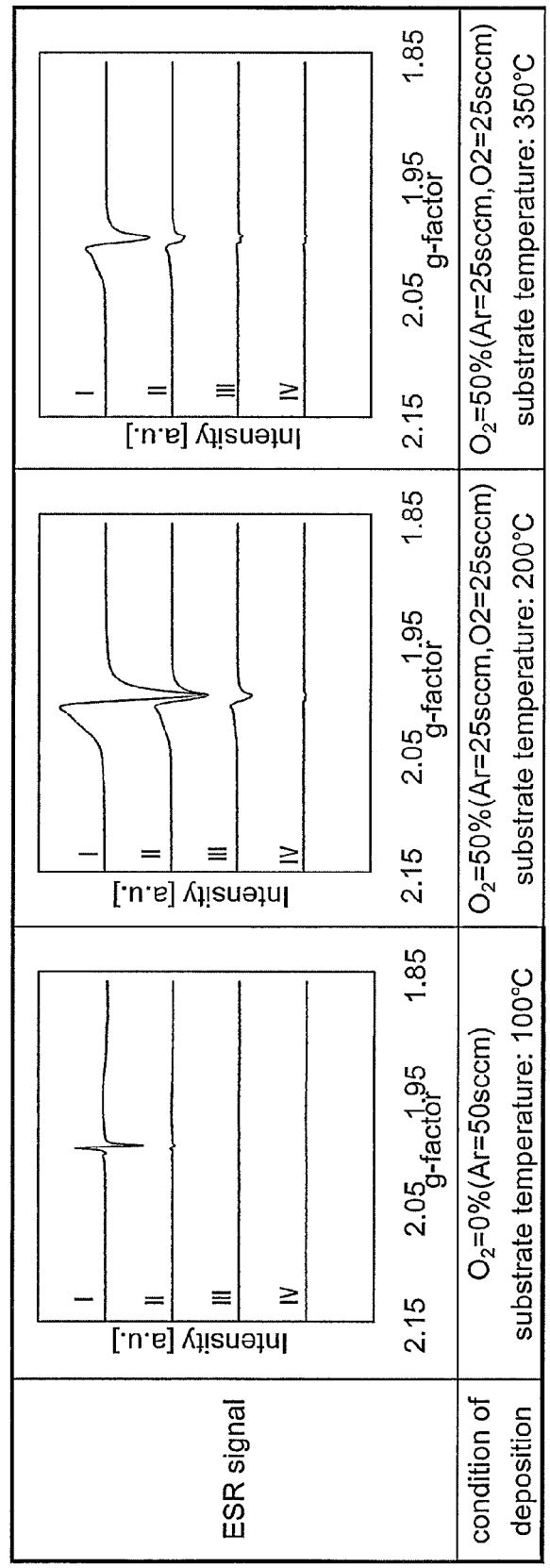
FIG. 33 shows ESR signals.

Meanwhile, in the hafnium oxide films formed under much oxygen (50% oxygen), the spin density at a g-factor of around 1.92 is hardly observed and the spin density at a g-factor of around 2.00 (2.00 to 2.01) is higher than that in the hafnium oxide films formed under 0% oxygen as shown in FIG. 23. This is probably due to excess oxygen. In addition, FIG. 33 indicates that signals at a g-factor of around 2.00 have asymmetrical shapes.

Example 3

In this example, a hafnium oxide film was formed over a thermal oxidation film and oxygen release from the thermal oxidation film was examined by thermal desorption spectroscopy (TDS).

A measurement sample is described.

A silicon wafer was thermally oxidized so that a thermal oxidation film was formed to 100 nm on a surface of the silicon wafer. The thermal oxidation was performed at 950° C. for four hours in a thermal oxidation atmosphere containing HCl at 3 vol % with respect to oxygen.

Next, a hafnium oxide film was formed to have a thickness of 20 nm over the thermal oxidation film by a sputtering method under the following conditions: a hafnium oxide target was used; an argon (Ar) gas and an oxygen ($O_2$) gas (an argon gas at a flow rate of 25 sccm and an oxygen gas at a flow rate of 25 sccm: 50% oxygen) were used as deposition gases; pressure was 0.6 Pa; substrate temperature was 200° C.; and an RF power of 2.5 kW was applied.

Then, the hafnium oxide film was completely etched. The etching for fabricating an example sample was inductively coupled plasma (ICP) etching performed under the following conditions: a boron trichloride ($BCl_3$) atmosphere at a flow rate of 80 sccm was used; power supply was 450 W; bias power was 100 W; pressure was 1.0 Pa; and substrate temperature was 70° C. Note that a comparative sample with a thermal oxidation film on a silicon wafer and without a hafnium oxide film was also fabricated.

Figure 24A:
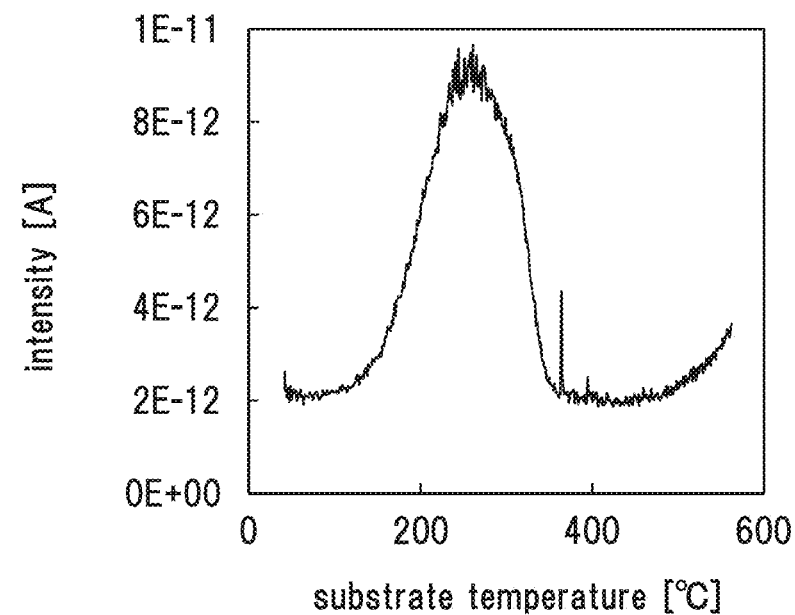
FIGS. 24A and 24B show TDS measurement results.
Figure 24B:
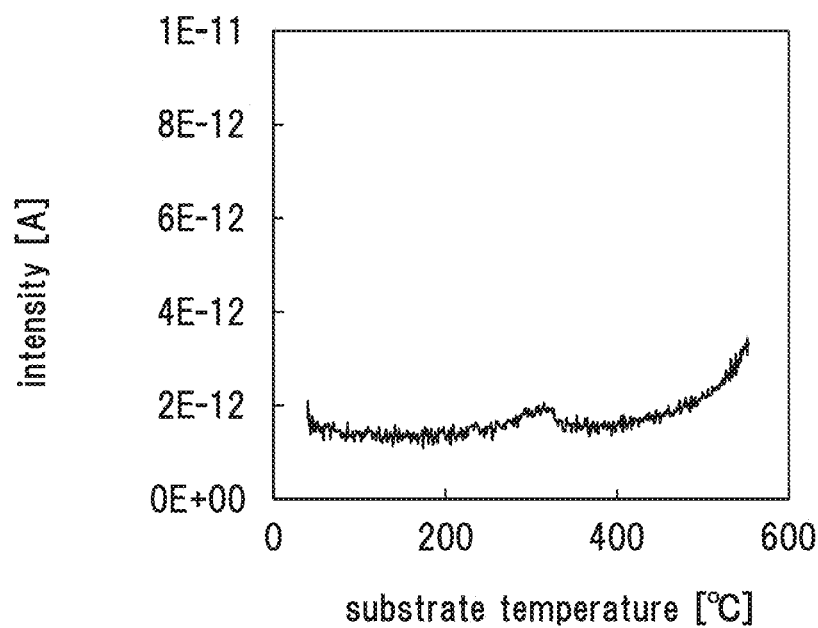

FIG. 24A shows substrate temperature and ion intensity at a mass-to-charge ratio (m/z) of 32 of the example sample measured by TDS. FIG. 24B shows substrate temperature and ion intensity at a mass-to-charge ratio (m/z) of 32 of the comparative sample measured by TDS. Examples of a gas detected at m/z of 32 include an oxygen gas ($O_2$). In this example, all the gases detected at m/z of 32 were regarded as an oxygen gas.

FIG. 24B shows that the comparative sample released a small amount of oxygen gas at any substrate temperature. FIG. 24A shows that the example sample on which the hafnium oxide film was once formed released an oxygen gas at a substrate temperature in the range of approximately 150° C. to 350° C.

The results suggest that a hafnium oxide film in contact with an oxide semiconductor layer can supply oxygen to the oxide semiconductor layer and reduce oxygen vacancies in the oxide semiconductor layer.

Example 4

In this example, a transistor having the same structure as the transistor illustrated in FIGS. 3A to 3C was fabricated as an example sample and the electrical characteristics of the transistor were evaluated.

A method for fabricating example samples is described.

First, a silicon wafer was thermally oxidized in an HCl atmosphere so that a thermal oxidation film was formed to 100 nm on a surface of the silicon wafer. The thermal oxidation was performed at 950° C. for four hours in a thermal oxidation atmosphere containing HCl at 3 vol % with respect to oxygen.

Next, over the thermal oxidation film, a silicon oxynitride film to be a base insulating film was formed to have a thickness of 300 nm by a PECVD method under the following conditions: silane ($SiH_4$) at a flow rate of 2.3 sccm and dinitrogen monoxide ($N_2O$) at a flow rate of 800 sccm were used as source gases; pressure in a reaction chamber was 40 Pa; substrate temperature was 400° C.; and a high-frequency power of 50 W was supplied to parallel plate electrodes with a 27.12 MHz high frequency power source.

A surface of the silicon oxynitride film was subjected to polishing treatment. After that, a first oxide semiconductor film was formed to have a thickness of 20 nm by a sputtering method under the following conditions: an oxide target whose atomic ratio of In to Ga and Zn is 1:3:2 was used; an argon (Ar) gas at a flow rate of 30 sccm and an oxygen ($O_2$) gas at a flow rate of 15 sccm were used as deposition gases; pressure was 0.4 Pa; substrate temperature was 200° C.; the distance between the target and the substrate was 60 mm; and a DC power of 0.5 kW was applied.

Then, over the first oxide semiconductor film, a second oxide semiconductor film was formed to have a thickness of 15 nm by a sputtering method under the following conditions: an oxide target whose atomic ratio of In to Ga and Zn is 1:1:1 was used; an argon (Ar) gas at a flow rate of 30 sccm and an oxygen ($O_2$) gas at a flow rate of 15 sccm were used as deposition gases; pressure was 0.4 Pa; substrate temperature was 300° C.; the distance between the target and the substrate was 60 mm; and a DC power of 0.5 kW was applied. Note that the first oxide semiconductor film and the second oxide semiconductor film were successively formed without exposure to the air.

Next, heat treatment was performed. The heat treatment was performed under a nitrogen atmosphere at 450° C. for one hour, and then performed under an oxygen atmosphere at 450° C. for one hour.

Then, the first and second semiconductor films were processed into island shapes by ICP etching under the following conditions: a mixed atmosphere of boron trichloride ($BCl_3$) at a flow rate of 60 sccm and chlorine ($Cl_2$) at a flow rate of 20 sccm was used; power supply was 450 W; bias power was 100 W; pressure was 1.9 Pa; and substrate temperature was 70° C.

Next, a tungsten film was formed over the first and second oxide semiconductor films to have a thickness of 100 nm by a sputtering method under the following conditions: a tungsten target was used; an argon (Ar) gas at a flow rate of 80 sccm was used as a deposition gas; pressure was 0.8 Pa; substrate temperature was 230° C.; the distance between the target and the substrate was 60 mm; and a DC power of 1.0 kW was applied.

Subsequently, the tungsten film was subjected to ICP etching three times to form a source electrode and a drain electrode. The first etching was performed under the following conditions: a mixed atmosphere of a carbon tetrafluoride ($CF_4$) gas at a flow rate of 45 sccm, a chlorine ($Cl_2$) gas at a flow rate of 45 sccm, and an oxygen ($O_2$) gas at a flow rate of 55 sccm was used; power supply was 3000 W; bias power was 110 W; and pressure was 0.67 Pa. The second etching was performed under the following conditions: an oxygen ($O_2$) atmosphere at a flow rate of 100 sccm was used; power supply was 2000 W; bias power was 0 W; and pressure was 3.00 Pa. The third etching was performed under the following conditions: a mixed atmosphere of a carbon tetrafluoride ($CF_4$) gas at a flow rate of 45 sccm, a chlorine ($Cl_2$) gas at a flow rate of 45 sccm, and an oxygen ($O_2$) gas at a flow rate of 55 sccm was used; power supply was 3000 W; bias power was 110 W: and pressure was 0.67 Pa.

Then, over the second oxide semiconductor film and the source and drain electrodes, a third oxide semiconductor film was formed to have a thickness of 5 nm by a sputtering method under the following conditions: an oxide target whose atomic ratio of In to Ga and Zn is 1:3:2 was used; an argon (Ar) gas at a flow rate of 30 sccm and an oxygen ($O_2$) gas at a flow rate of 15 sccm were used as deposition gases; pressure was 0.4 Pa; substrate temperature was 200° C.; the distance between the target and the substrate was 60 mm; and a DC power of 0.5 kW was applied.

Next, a hafnium oxide film to be a first gate insulating film was formed to have a thickness of 20 nm over the third oxide semiconductor film by a sputtering method under the following conditions: a hafnium oxide target was used; an argon gas at a flow rate of 25 sccm and an oxygen gas at a flow rate of 25 sccm were used as deposition gases; pressure was 0.6 Pa; substrate temperature was 200° C.; and an RF power of 2.5 kW was applied.

After that, over the hafnium oxide film, a silicon oxynitride film to be a second gate insulating film was formed to have a thickness of 15 nm by a PECVD method under the following conditions: silane ($SiH_4$) at a flow rate of 1 sccm and dinitrogen monoxide ($N_2O$) at a flow rate of 800 sccm were used as source gases; pressure in a reaction chamber was 200 Pa; substrate temperature was 350° C.; and a high-frequency power of 150 W was supplied to parallel plate electrodes with a 60 MHz high frequency power source.

Next, a tantalum nitride film was formed to have a thickness of 30 nm over the silicon oxynitride film by a sputtering method under the following conditions: a tantalum nitride target was used; an argon (Ar) gas at a flow rate of 50 sccm and a nitrogen ($N_2$) gas at a flow rate of 10 sccm were used as deposition gases; pressure was 0.6 Pa; substrate temperature was room temperature; and a DC power of 1.0 kW was applied. Over the tantalum nitride film, a tungsten film was formed to have a thickness of 135 nm by a sputtering method under the following conditions: a tungsten target was used; an argon gas at a flow rate of 100 sccm was used as a deposition gas; pressure was 2.0 Pa; substrate temperature was 230° C.; the distance between the target and the substrate was 60 mm: and a DC power of 4.0 kW was applied.

After that, the tantalum nitride film and the tungsten film were subjected to ICP etching twice to form a gate electrode. The first etching was performed under the following conditions: a mixed atmosphere of a carbon tetrafluoride ($CF_4$) gas at a flow rate of 55 sccm, a chlorine ($Cl_2$) gas at a flow rate of 45 sccm, and an oxygen ($O_2$) gas at a flow rate of 55 sccm was used; power supply was 3000 W; bias power was 110 W; and pressure was 0.67 Pa. The second etching was performed under the following conditions: a chlorine ($Cl_2$) atmosphere at a flow rate of 100 sccm was used; power supply was 2000 W; bias power was 50 W; and pressure was 0.67 Pa.

Then, with the use of the gate electrode as a mask, the first and second gate insulating films and the third oxide semiconductor film were processed into island shapes by ICP etching under the following conditions: a boron trichloride ($BCl_3$) gas atmosphere at a flow rate of 80 sccm was used; power supply was 450 W; bias power was 100 W; and pressure was 1.0 Pa.

Subsequently, over the gate electrode and the source and drain electrodes, an aluminum oxide film was formed to have a thickness of 70 nm by a sputtering method under the following conditions: an aluminum oxide target was used; an argon (Ar) gas at a flow rate of 25 sccm and an oxygen ($O_2$) gas at a flow rate of 25 sccm were used as deposition gases; pressure was 0.4 Pa; substrate temperature was 250° C.; the distance between the target and the substrate was 60 mm; and an RF power of 2.5 kW was applied.

Then, over the aluminum oxide film, a silicon oxynitride film was formed to have a thickness of 300 nm by a PECVD method under the following conditions: silane (SiH) at a flow rate of 5 sccm and dinitrogen monoxide ($N_2O$) at a flow rate of 1000 sccm were used as source gases; pressure in a reaction chamber was 133 Pa; substrate temperature was 325° C.; and a high-frequency power of 35 W was supplied to parallel plate electrodes with a 13.56 MHz high frequency power source.

Through the above steps, transistors of the example sample were fabricated. Note that the fabricated transistor having a channel length of 0.48 μm and a channel width of 0.80 m is referred to as Example Sample A, and the fabricated transistor having a channel length of 0.83 m and a channel width of 0.80 μm is referred to as Example Sample B.

Figure 25A:
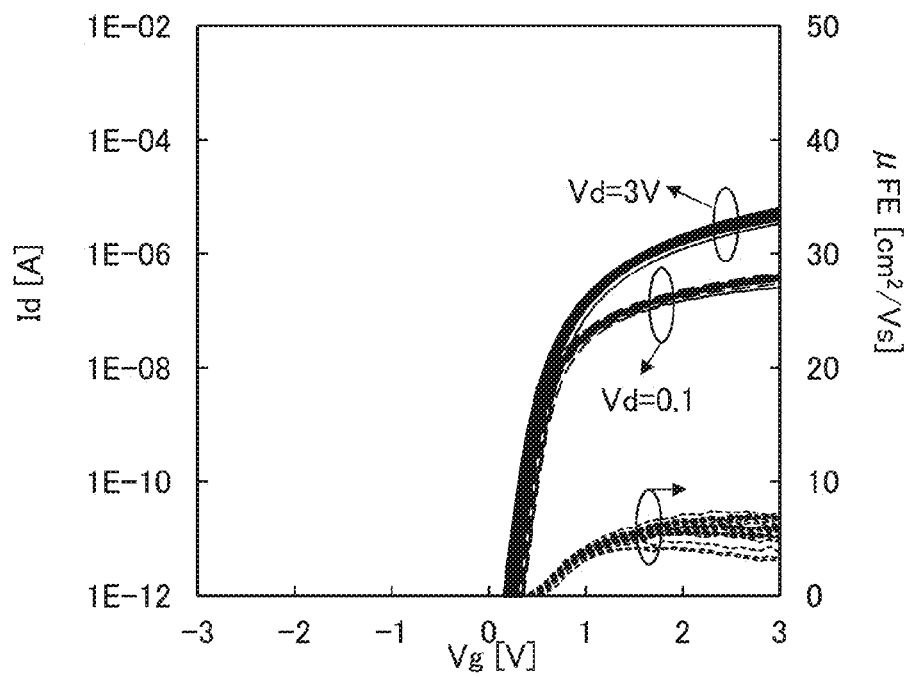
FIGS. 25A and 25B each show measured electrical characteristics of a transistor.
Figure 25B:
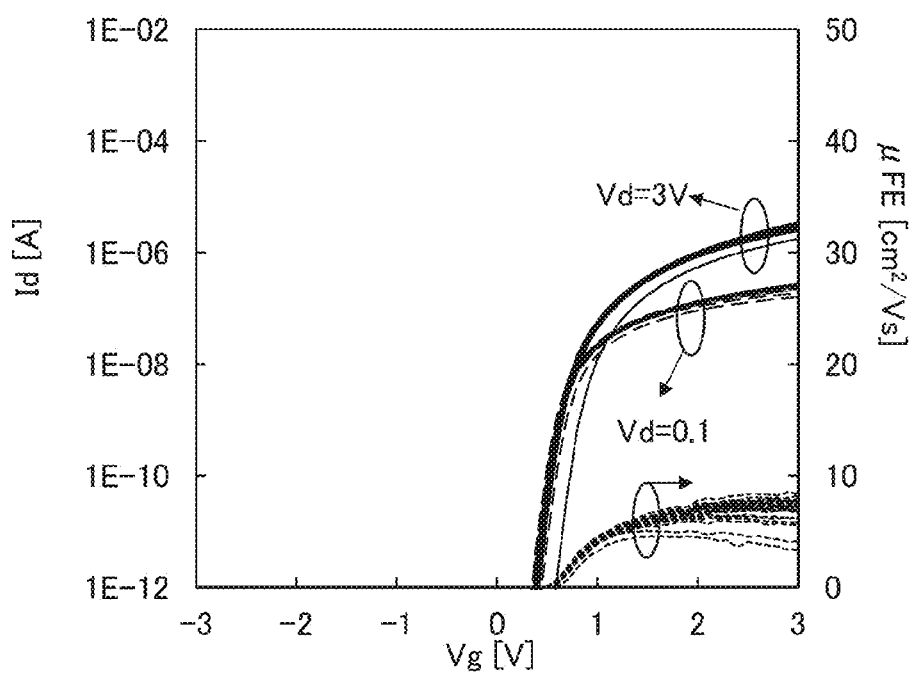

Next, in the fabricated two transistors, a drain current ($I_d$: [A]) was measured under the conditions where a drain voltage ($V_d$: [V]) was set to 0.1 V or 3.0 V and a gate voltage ($V_g$: [V]) was swept from −3 V to 3 V. FIGS. 25A and 25B show the measurement results. In FIGS. 25A and 25B, the solid lines represent measurement results at a drain voltage ($V_d$: [V]) of 3 V, dotted lines represent measurement results at a drain voltage ($V_d$: [V]) of 0.1 V, lateral axes indicate the gate voltage ($V_g$: [V]), and the left longitudinal axes indicate the drain current ($I_d$: [A]). FIGS. 25A and 25B also show measured mobility at a drain voltage ($V_d$: [V]) of 0.1 V, and the right longitudinal axes indicate the mobility (μFE: $cm^2$/Vs). Note that "drain voltage ($V_d$: [V])" refers to a potential difference between a drain and a source when the potential of the source is used as a reference potential, and "gate voltage (V: [V])" refers to a potential difference between a gate and a source when the potential of the source is used as a reference potential. FIGS. 25A and 25B show measurement results of Example Sample A and Example Sample B, respectively.

FIG. 25A shows Example Sample A in which an S-value at a drain voltage ($V_d$: [V]) of 0.1 V is 77.2 mV/dec. and the mobility is 6.2 $cm^2$/Vs. FIG. 25B shows Example Sample B in which an S-value at a drain voltage ($V_d$: [V]) of 0.1 V is 71.8 mV/dec. and the mobility is 7.4 $cm^2$/Vs.

Figure 26A:
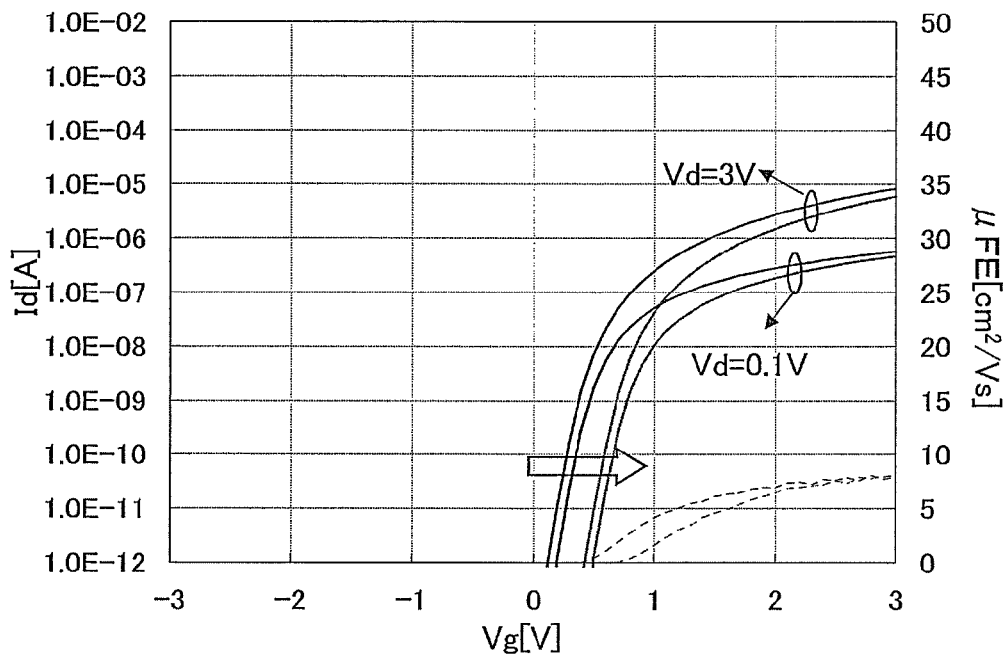
FIGS. 26A and 26B each show measured electrical characteristics of a transistor.

Next, Example Sample A was subjected to a stress test at a source voltage ($V_s$: [V]) and a drain voltage ($V_d$: [V]) of 0 V and a gate voltage ($V_g$: [V]) of 3.3 V at 150° C. for one hour. FIG. 26A shows the measurement results. FIG. 26A shows the measurement results at drain voltages ($V_d$: [V]) of 0.1 V and 3.0 V, where the lateral axis represents a gate voltage ($V_g$: [V]) and the longitudinal axis represents a drain current ($I_d$: [A]). Note that solid lines in FIG. 26A represent, from the left, measurement results before a stress test at $V_d$ of 3 V, before a stress test at $V_d$ of 0.1 V, after the stress test at $V_d$ of 3 V, and after the stress test at $V_d$ of 0.1 V.

Figure 26B:
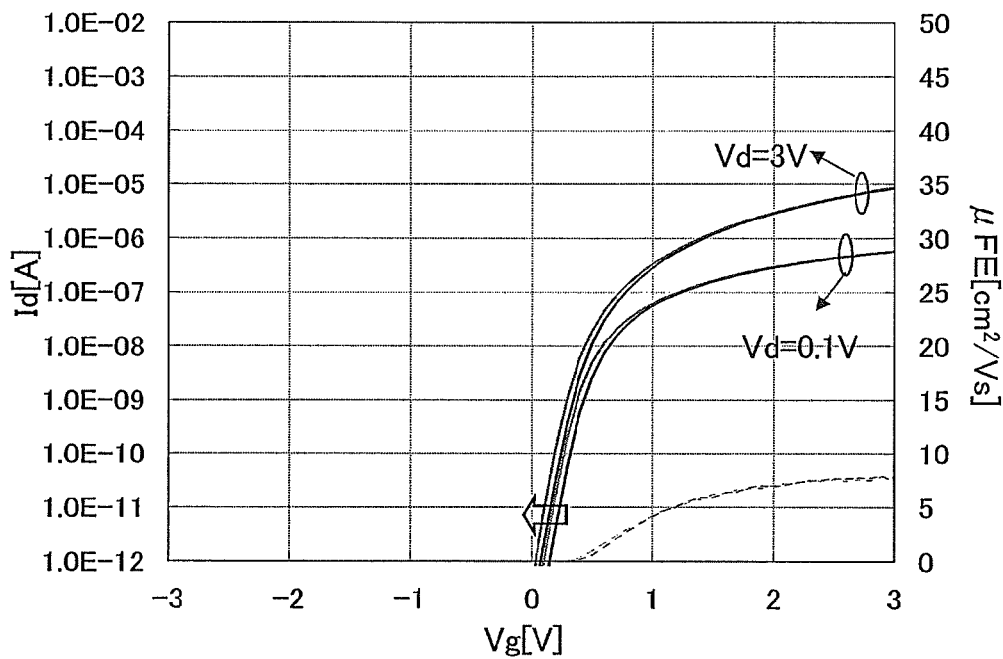

FIG. 26B shows the measurement results obtained when Example Sample A was subjected to a stress test at a source voltage ($V_s$: [V]) and a drain voltage ($V_d$: [V]) of 0 V and a gate voltage ($V_g$: [V]) of −3.3 V at 150° C. for one hour. FIG. 26B shows the measurement results at drain voltages ($V_d$: [V]) of 0.1 V and 3.0 V, where the lateral axis represents a gate voltage (V: [V]) and the longitudinal axis represents a drain current ($I_d$: [A]). Note that solid lines in FIG. 26A represent, from the left, measurement results after a stress test at $V_d$ of 3 V, before the stress test at $V_d$ of 3 V, after a stress test at $V_d$ of 0.1 V, and before the stress test at $V_d$ of 0.1 V.

As shown in FIG. 26A, a change $\Delta V_{th}$ in threshold voltage at a drain voltage ($V_d$: [V]) of 3.0 V was 0.34 V. As shown in FIG. 26B, a change $\Delta V_{th}$ in threshold voltage at a drain voltage ($V_d$: [V]) of 3.0 V was 0.03 V. FIGS. 26A and 26B indicate that Example Sample A has a small change in threshold voltage and high reliability.

Example 5

In this example, the difference between the electrical characteristics due to the existence of a third oxide semiconductor film or a stack including gate insulating films was examined.

A method for fabricating example samples is described.

First, a silicon wafer was thermally oxidized so that a thermal oxidation film was formed to 100 nm on a surface of the silicon wafer. The thermal oxidation was performed at 950° C. for four hours in a thermal oxidation atmosphere containing HCl at 3 vol % with respect to oxygen.

Next, over the thermal oxidation film, a silicon oxynitride film to be a base insulating film was formed to have a thickness of 300 nm by a PECVD method under the following conditions: silane ($SiH_4$) at a flow rate of 2.3 sccm and dinitrogen monoxide ($N_2$) at a flow rate of 800 sccm were used as source gases; pressure in a reaction chamber was 40 Pa; substrate temperature was 400° C.; and a high-frequency power of 50 W was supplied to parallel plate electrodes with a 27.12 MHz high frequency power source.

A surface of the silicon oxynitride film was subjected to polishing treatment. After that, a first oxide semiconductor film was formed to have a thickness of 20 nm by a sputtering method under the following conditions: an oxide target whose atomic ratio of In to Ga and Zn is 1:3:4 was used; an argon (Ar) gas at a flow rate of 30 sccm and an oxygen ($O_2$) gas at a flow rate of 15 sccm were used as deposition gases; pressure was 0.4 Pa; substrate temperature was 200° C.; the distance between the target and the substrate was 60 mm; and a DC power of 0.5 kW was applied.

Then, over the first oxide semiconductor film, a second oxide semiconductor film was formed to have a thickness of 15 nm by a sputtering method under the following conditions: an oxide target whose atomic ratio of In to Ga and Zn is 1:1:1 was used; an argon (Ar) gas at a flow rate of 30 sccm and an oxygen ($O_2$) gas at a flow rate of 15 sccm were used as deposition gases; pressure was 0.4 Pa; substrate temperature was 300° C.; the distance between the target and the substrate was 60 mm; and a DC power of 0.5 kW was applied. Note that the first oxide semiconductor film and the second oxide semiconductor film were successively formed without exposure to the air.

Next, heat treatment was performed. The heat treatment was performed under a nitrogen atmosphere at 450° C. for one hour, and then performed under an oxygen atmosphere at 450° C.

Then, the first and second semiconductor films were processed into island shapes by ICP etching under the following conditions: a mixed atmosphere of boron trichloride ($BCl_3$) at a flow rate of 60 sccm and chlorine ($Cl_2$) at a flow rate of 20 sccm was used; power supply was 450 W; bias power was 100 W; pressure was 1.9 Pa; and substrate temperature was 70° C.

Next, a tungsten film was formed over the first and second oxide semiconductor films to have a thickness of 100 nm by a sputtering method under the following conditions: a tungsten target was used; an argon (Ar) gas at a flow rate of 80 sccm was used as a deposition gas; pressure was 0.8 Pa; substrate temperature was 230° C.; the distance between the target and the substrate was 60 mm; and a DC power of 1.0 kW was applied.

Subsequently, the tungsten film was subjected to ICP etching three times to form a source electrode and a drain electrode. The first etching was performed under the following conditions: a mixed atmosphere of a carbon tetrafluoride ($CF_4$) gas at a flow rate of 45 sccm, a chlorine ($Cl_2$) gas at a flow rate of 45 sccm, and an oxygen ($O_2$) gas at a flow rate of 55 sccm was used; power supply was 3000 W; bias power was 110 W; and pressure was 0.67 Pa. The second etching was performed under the following conditions: an oxygen ($O_2$) atmosphere at a flow rate of 100 sccm was used; power supply was 2000 W; bias power was 0 W; and pressure was 3.00 Pa. The third etching was performed under the following conditions: a mixed atmosphere of a carbon tetrafluoride ($CF_4$) gas at a flow rate of 45 sccm, a chlorine ($Cl_2$) gas at a flow rate of 45 sccm, and an oxygen ($O_2$) gas at a flow rate of 55 sccm was used; power supply was 3000 W; bias power was 110 W; and pressure was 0.67 Pa.

Then, over the second oxide semiconductor film and the source and drain electrodes, a third oxide semiconductor film was formed to have a thickness of 5 nm by a sputtering method under the following conditions: an oxide target whose atomic ratio of In to Ga and Zn is 1:3:2 was used; an argon (Ar) gas at a flow rate of 30 sccm and an oxygen ($O_2$) gas at a flow rate of 15 sccm were used as deposition gases; pressure was 0.4 Pa; substrate temperature was 200° C.; the distance between the target and the substrate was 60 mm; and a DC power of 0.5 kW was applied.

Next, a hafnium oxide film to be a first gate insulating film was formed to have a thickness of 20 nm over the third oxide semiconductor film by a sputtering method under the following conditions: a hafnium oxide target was used; an argon gas at a flow rate of 25 sccm and an oxygen gas at a flow rate of 25 sccm were used as deposition gases; pressure was 0.6 Pa; substrate temperature was 200° C.; and an RF power of 2.5 kW was applied.

After that, over the hafnium oxide film, a silicon oxynitride film to be a second gate insulating film was formed to have a thickness of 15 nm by a PECVD method under the following conditions: silane ($SiH_4$) at a flow rate of 1 sccm and dinitrogen monoxide ($N_2O$) at a flow rate of 800 sccm were used as source gases; pressure in a reaction chamber was 200 Pa; substrate temperature was 350° C.; and a high-frequency power of 150 W was supplied to parallel plate electrodes with a 60 MHz high frequency power source.

Next, a tantalum nitride film was formed to have a thickness of 30 nm over the silicon oxynitride film by a sputtering method under the following conditions: a tantalum nitride target was used; an argon (Ar) gas at a flow rate of 50 sccm and a nitrogen ($N_2$) gas at a flow rate of 10 sccm were used as deposition gases; pressure was 0.6 Pa; substrate temperature was room temperature; and a DC power of 1.0 kW was applied. Over the tantalum nitride film, a tungsten film was formed to have a thickness of 135 nm by a sputtering method under the following conditions: a tungsten target was used; an argon gas at a flow rate of 100 sccm was used as a deposition gas; pressure was 2.0 Pa; substrate temperature was 230° C.; the distance between the target and the substrate was 60 mm: and a DC power of 4.0 kW was applied.

After that, the tantalum nitride film and the tungsten film were subjected to ICP etching twice to form a gate electrode. The first etching was performed under the following conditions: a mixed atmosphere of a carbon tetrafluoride ($CF_4$) gas at a flow rate of 55 sccm, a chlorine (Cl$_2$) gas at a flow rate of 45 sccm, and an oxygen (O$_2$) gas at a flow rate of 55 sccm was used; power supply was 3000 W; bias power was 110 W; and pressure was 0.67 Pa. The second etching was performed under the following conditions: a chlorine (Cl$_2$) atmosphere at a flow rate of 100 sccm was used; power supply was 2000 W; bias power was 50 W; and pressure was 0.67 Pa.

Then, with the use of a mask, the first and second gate insulating films and the third oxide semiconductor film were processed into island shapes by ICP etching under the following conditions: a boron trichloride (BCl$_3$) gas atmosphere at a flow rate of 80 sccm was used; power supply was 450 W; bias power was 100 W; and pressure was 1.0 Pa.

Subsequently, over the gate electrode and the source and drain electrodes, an aluminum oxide film was formed to have a thickness of 70 nm by a sputtering method under the following conditions: an aluminum oxide target was used; an argon (Ar) gas at a flow rate of 25 sccm and an oxygen (O$_2$) gas at a flow rate of 25 sccm were used as deposition gases; pressure was 0.4 Pa; substrate temperature was 250° C.; the distance between the target and the substrate was 60 mm; and a DC power of 2.5 kW was applied.

Then, over the aluminum oxide film, a silicon oxynitride film was formed to have a thickness of 300 nm by a PECVD method under the following conditions: silane (SiH$_4$) at a flow rate of 5 sccm and dinitrogen monoxide (N$_2$O) at a flow rate of 1000 sccm were used as source gases; pressure in a reaction chamber was 133 Pa; substrate temperature was 325° C.; and a high-frequency power of 35 W was supplied to parallel plate electrodes with a 13.56 MHz high frequency power source.

Through the above steps, transistors of the example sample were fabricated. Note that the fabricated transistor having a channel length of 0.47 μm and a channel width of 1.0 μm is referred to as Example Sample C. The transistor having the same structure as Example Sample C except for the gate insulating film (only the first gate insulating film was provided and the second gate insulating film was not provided) is referred to as Comparative Sample D. The transistor having the same structure as Example Sample C except that the third oxide semiconductor film was not provided is referred to as Comparative Sample E.

Figure 27:
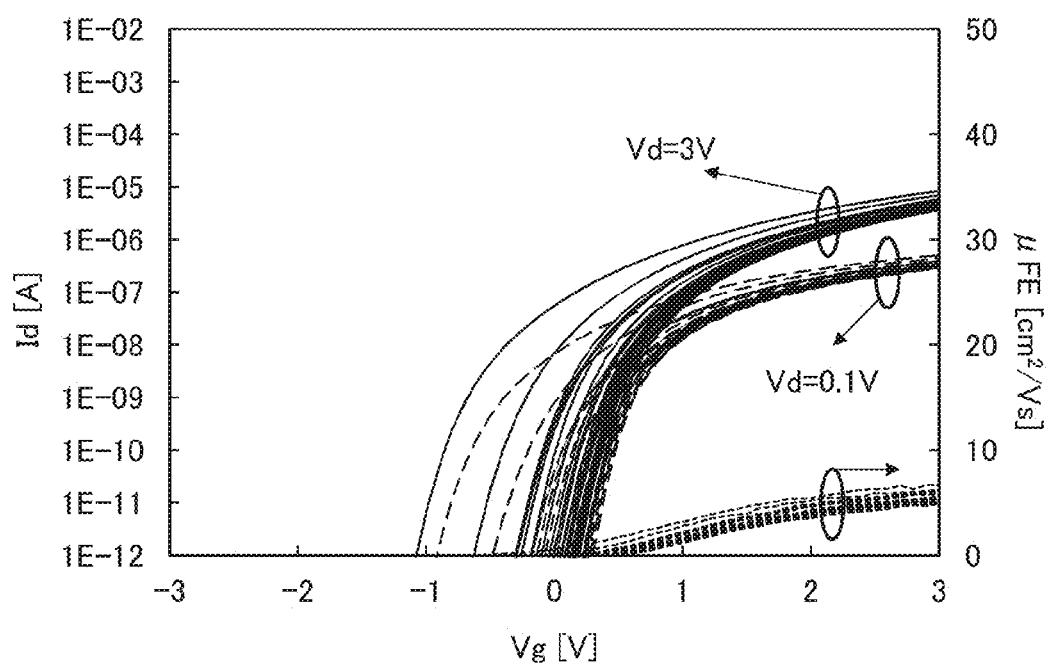
FIG. 27 shows measured electrical characteristics of a transistor.
Figure 28:
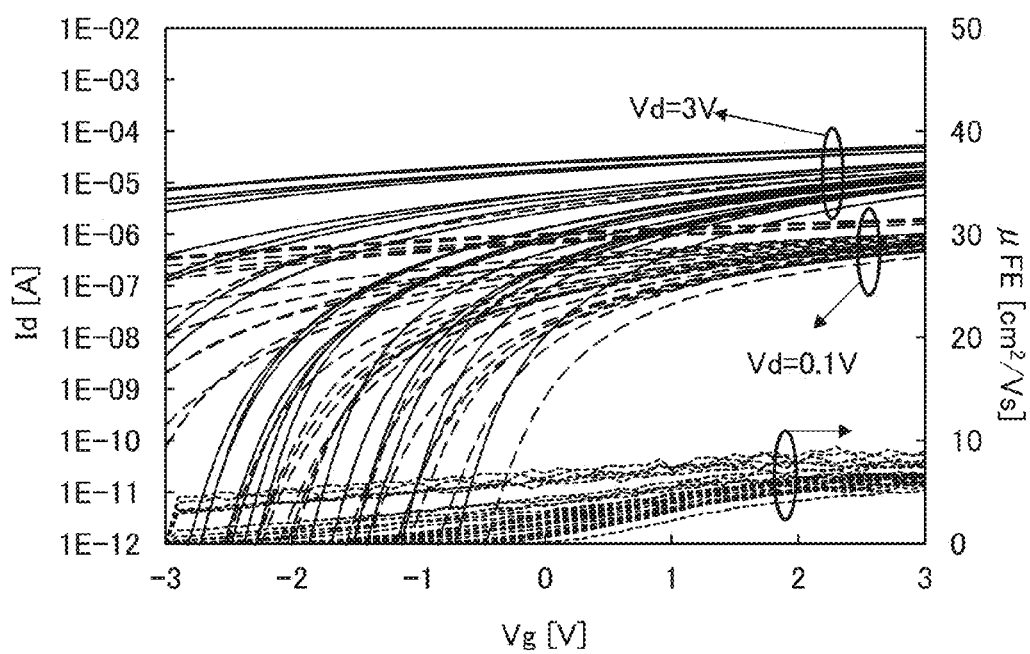
FIG. 28 shows measured electrical characteristics of a transistor.
Figure 29:
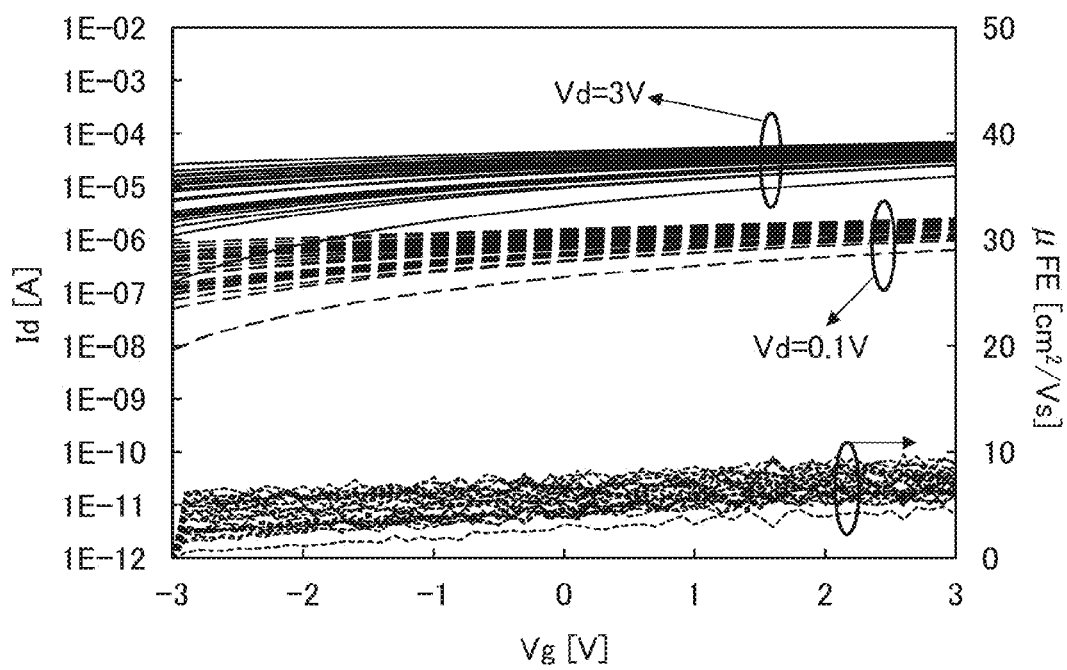
FIG. 29 shows measured electrical characteristics of a transistor.

Next, in the formed three transistors, a drain current (I$_d$: [A]) was measured under the conditions where a drain voltage (V$_d$: [V]) was set to 0.1 V or 3.0 V and a gate voltage (V$_g$: [V]) was swept from −3 V to 3 V. FIGS. 27 to 29 show the measurement results. In FIGS. 27 to 29, the solid lines represent measurement results at a drain voltage (V$_d$: [V]) of 3 V, dotted lines represent measurement results at a drain voltage (V$_d$: [V]) of 0.1 V, lateral axes indicate the gate voltage (V$_g$: [V]), and the left longitudinal axes indicate the drain current (I$_d$: [A]). FIGS. 27 to 29 also show measured mobility at a drain voltage (V$_d$: [V]) of 0.1 V, and the right longitudinal axes indicate the mobility (μFE: cm$^2$/Vs). FIG. 27, FIG. 28, and FIG. 29 show measurement results of Example Sample C, Comparative Sample D, and Comparative Sample E, respectively.

The results in FIGS. 27 to 29 show that only Example Sample C has switching characteristics. The results also show that switching characteristics cannot be obtained in the case where only a hafnium oxide film is used as a gate insulating film or the case where the third oxide semiconductor film is not provided.

This application is based on Japanese Patent Application serial no. 2013-196301 filed with Japan Patent Office on Sep. 23, 2013, the entire contents of which are hereby incorporated by reference.

What is claimed is:

1. A semiconductor device comprising:
a transistor comprising:
a first gate electrode;
a semiconductor layer comprising a channel formation region and overlapping with the first gate electrode;
a first insulating film between the first gate electrode and the semiconductor layer;
a second insulating film between the first gate electrode and the first insulating film; and
a source electrode and a drain electrode each in contact with a side surface of the semiconductor layer,
wherein the semiconductor layer comprises indium, zinc, and oxygen,
wherein the semiconductor layer comprises:
a first semiconductor film;
a second semiconductor film over the first semiconductor film; and
a third semiconductor film over the second semiconductor film, and
wherein the first insulating film has a higher dielectric constant than the second insulating film.

2. The semiconductor device according to claim 1, wherein each of the source electrode and the drain electrode is in contact with an upper surface of the second semiconductor film and a lower surface of the third semiconductor film.

3. The semiconductor device according to claim 1, wherein the first gate electrode faces a side surface of the second semiconductor film.

4. The semiconductor device according to claim 3, wherein the second semiconductor film is between a first region and a second region of the first gate electrode.

5. The semiconductor device according to claim 1, comprising a third insulating film under the semiconductor layer,
wherein the third insulating film comprises a projecting portion,
wherein the first semiconductor film is over the projecting portion, and
wherein the third semiconductor film is in contact with the projecting portion.

6. The semiconductor device according to claim 1, wherein the first gate electrode is over the semiconductor layer.

7. The semiconductor device according to claim 1, wherein the semiconductor layer is over the first gate electrode.

8. The semiconductor device according to claim 1,
wherein the transistor comprises a second gate electrode overlapping with the first gate electrode, and
wherein the semiconductor layer, the first insulating film, and the second insulating film are between the first gate electrode and the second gate electrode.

9. A semiconductor device comprising:
a transistor comprising:
a first gate electrode;
a semiconductor layer comprising a channel formation region and overlapping with the first gate electrode;
a first insulating film between the first gate electrode and the semiconductor layer;
a second insulating film between the first gate electrode and the first insulating film; and
a source electrode and a drain electrode each in contact with a side surface of the semiconductor layer,
wherein the semiconductor layer comprises indium, zinc, and oxygen,
wherein the semiconductor layer comprises:
a first semiconductor film;
a second semiconductor film over the first semiconductor film; and a third semiconductor film over the second semiconductor film, and wherein a band gap of the first insulating film is smaller than a band gap of the second insulating film and larger than a band gap of the semiconductor layer.

10. The semiconductor device according to claim 9, wherein each of the source electrode and the drain electrode is in contact with an upper surface of the second semiconductor film and a lower surface of the third semiconductor film.

11. The semiconductor device according to claim 9, wherein the first gate electrode faces a side surface of the second semiconductor film.

12. The semiconductor device according to claim 11, wherein the second semiconductor film is between a first region and a second region of the first gate electrode.

13. The semiconductor device according to claim 9, comprising a third insulating film under the semiconductor layer,
wherein the third insulating film comprises a projecting portion,
wherein the first semiconductor film is over the projecting portion, and
wherein the third semiconductor film is in contact with the projecting portion.

14. The semiconductor device according to claim 9, wherein the first gate electrode is over the semiconductor layer.

15. The semiconductor device according to claim 9, wherein the semiconductor layer is over the first gate electrode.

16. The semiconductor device according to claim 9,
wherein the transistor comprises a second gate electrode overlapping with the first gate electrode, and
wherein the semiconductor layer, the first insulating film, and the second insulating film are between the first gate electrode and the second gate electrode.

17. A semiconductor device comprising:
a transistor comprising:
a first gate electrode;
a semiconductor layer comprising a channel formation region and overlapping with the first gate electrode;
a first insulating film between the first gate electrode and the semiconductor layer;
a second insulating film between the first gate electrode and the first insulating film; and
a source electrode and a drain electrode each in contact with a side surface of the semiconductor layer,
wherein the semiconductor layer comprises indium, zinc, and oxygen,
wherein the semiconductor layer comprises:
a first semiconductor film;
a second semiconductor film over the first semiconductor film; and
a third semiconductor film over the second semiconductor film, and
wherein the first insulating film comprises hafnium oxide.

18. The semiconductor device according to claim 17, wherein each of the source electrode and the drain electrode is in contact with an upper surface of the second semiconductor film and a lower surface of the third semiconductor film.

19. The semiconductor device according to claim 17, wherein the first gate electrode faces a side surface of the second semiconductor film.

20. The semiconductor device according to claim 19, wherein the second semiconductor film is between a first region and a second region of the first gate electrode.

21. The semiconductor device according to claim 17, comprising a third insulating film under the semiconductor layer,
wherein the third insulating film comprises a projecting portion,
wherein the first semiconductor film is over the projecting portion, and
wherein the third semiconductor film is in contact with the projecting portion.

22. The semiconductor device according to claim 17, wherein the first gate electrode is over the semiconductor layer.

23. The semiconductor device according to claim 17, wherein the semiconductor layer is over the first gate electrode.

24. The semiconductor device according to claim 17,
wherein the transistor comprises a second gate electrode overlapping with the first gate electrode, and
wherein the semiconductor layer, the first insulating film, and the second insulating film are between the first gate electrode and the second gate electrode.

25. A semiconductor device comprising:
a transistor comprising:
a first gate electrode;
a semiconductor layer comprising a channel formation region and overlapping with the first gate electrode;
a first insulating film between the first gate electrode and the semiconductor layer;
a second insulating film between the first gate electrode and the first insulating film; and
a source electrode and a drain electrode each in contact with a side surface of the semiconductor layer,
wherein the semiconductor layer comprises indium, zinc, and oxygen,
wherein the semiconductor layer comprises:
a first semiconductor film;
a second semiconductor film over the first semiconductor film; and
a third semiconductor film over the second semiconductor film, wherein the first insulating film has a higher dielectric constant than the second insulating film, and
wherein the first insulating film comprises an oxide.

26. The semiconductor device according to claim 25, wherein the oxide comprises at least one element selected from the group consisting of Hf, Al, Ta, and Zr.

27. The semiconductor device according to claim 25, wherein each of the source electrode and the drain electrode is in contact with an upper surface of the second semiconductor film and a lower surface of the third semiconductor film.

28. The semiconductor device according to claim 25, wherein the first gate electrode faces a side surface of the second semiconductor film.

29. The semiconductor device according to claim 28, wherein the second semiconductor film is between a first region and a second region of the first gate electrode.

30. The semiconductor device according to claim 25, comprising a third insulating film under the semiconductor layer,
wherein the third insulating film comprises a projecting portion,
wherein the first semiconductor film is over the projecting portion, and
wherein the third semiconductor film is in contact with the projecting portion.

31. The semiconductor device according to claim 25, wherein the first gate electrode is over the semiconductor layer.

32. The semiconductor device according to claim 25, wherein the semiconductor layer is over the first gate electrode.

33. The semiconductor device according to claim 25,
wherein the transistor comprises a second gate electrode overlapping with the first gate electrode, and
wherein the semiconductor layer, the first insulating film, and the second insulating film are between the first gate electrode and the second gate electrode.

34. A semiconductor device comprising:
a transistor comprising:
  a first gate electrode;
  a semiconductor layer comprising a channel formation region and overlapping with the first gate electrode;
  a first insulating film between the first gate electrode and the semiconductor layer;
  a second insulating film between the first gate electrode and the first insulating film; and
  a source electrode and a drain electrode each in contact with a side surface of the semiconductor layer,
wherein the semiconductor layer comprises indium, zinc, and oxygen,
wherein the semiconductor layer comprises:
  a first semiconductor film;
  a second semiconductor film over the first semiconductor film; and
  a third semiconductor film over the second semiconductor film,
wherein a band gap of the first insulating film is smaller than a band gap of the second insulating film and larger than a band gap of the semiconductor layer, and
wherein the first insulating film comprises an oxide.

35. The semiconductor device according to claim 34, wherein the oxide comprises at least one element selected from the group consisting of Hf, Al, Ta, and Zr.

36. The semiconductor device according to claim 34, wherein each of the source electrode and the drain electrode is in contact with an upper surface of the second semiconductor film and a lower surface of the third semiconductor film.

37. The semiconductor device according to claim 34, wherein the first gate electrode faces a side surface of the second semiconductor film.

38. The semiconductor device according to claim 37, wherein the second semiconductor film is between a first region and a second region of the first gate electrode.

39. The semiconductor device according to claim 34, comprising a third insulating film under the semiconductor layer,
  wherein the third insulating film comprises a projecting portion,
  wherein the first semiconductor film is over the projecting portion, and
  wherein the third semiconductor film is in contact with the projecting portion.

40. The semiconductor device according to claim 34, wherein the first gate electrode is over the semiconductor layer.

41. The semiconductor device according to claim 34, wherein the semiconductor layer is over the first gate electrode.

42. The semiconductor device according to claim 34,
  wherein the transistor comprises a second gate electrode overlapping with the first gate electrode, and
  wherein the semiconductor layer, the first insulating film, and the second insulating film are between the first gate electrode and the second gate electrode.

* * * * *